United States Patent
Sato et al.

(10) Patent No.: US 9,961,785 B2
(45) Date of Patent: May 1, 2018

(54) WIRING SUBSTRATE AND SEMICONDUCTOR DEVICE

(71) Applicant: Shinko Electric Industries Co., Ltd., Nagano-ken (JP)

(72) Inventors: Junji Sato, Nagano (JP); Kiyotaka Mochizuki, Nagano (JP); Kazuhiro Kobayashi, Nagano (JP); Katsuya Fukase, Nagano (JP)

(73) Assignee: Shinko Electric Co., Ltd., Nagano-shi, Nagano-ken (JP)

( * ) Notice: Subject to any disclaimer, the term of this patent is extended or adjusted under 35 U.S.C. 154(b) by 114 days.

(21) Appl. No.: 14/848,453

(22) Filed: Sep. 9, 2015

(65) Prior Publication Data

US 2016/0081194 A1 Mar. 17, 2016

(30) Foreign Application Priority Data

Sep. 17, 2014 (JP) .................................. 2014-189223

(51) Int. Cl.
*H05K 3/46* (2006.01)
*H05K 1/18* (2006.01)

(52) U.S. Cl.
CPC ........... *H05K 3/4697* (2013.01); *H05K 1/185* (2013.01); *H01L 2224/16225* (2013.01);
(Continued)

(58) Field of Classification Search
CPC .... H05K 3/4697; H05K 1/185; H05K 3/4652; H05K 2201/10015; H01L 2924/15311;
(Continued)

(56) References Cited

U.S. PATENT DOCUMENTS 6,058,004 A * 5/2000 Duva ....................... H01G 4/38
156/300
7,287,321 B2 * 10/2007 Takeuchi ............... H05K 1/186
174/260
(Continued)

FOREIGN PATENT DOCUMENTS

JP 2011-216740 10/2011
JP 2015-109346 6/2015
(Continued)

OTHER PUBLICATIONS

Notice of Reasons for Refusal w/ English Translation; JP Appln. No. 2014-189223; dated Feb. 6, 2018; 5 pages.

*Primary Examiner* — Nathan Milakovich
(74) *Attorney, Agent, or Firm* — Fish & Richardson P.C.

(57) ABSTRACT

A wiring substrate includes a core, a first wiring layer formed on a first surface of the core, and a second wiring layer formed on a second surface of the core. The first wiring layer includes a first opening, and the second wiring layer includes a second opening. The core includes a plurality of electronic component accommodating bores that extend through the core at portions exposed from the first and second openings. An electronic component is arranged in each electronic component accommodating bore. The electronic component accommodating bores are filled with an insulating layer. The core includes a partition located between adjacent electronic component accommodating bores. The partition is formed by part of the core.

9 Claims, 18 Drawing Sheets

(52) U.S. Cl.
CPC ............... *H01L 2224/32225* (2013.01); *H01L 2224/73204* (2013.01); *H01L 2924/15311* (2013.01); *H05K 3/4652* (2013.01); *H05K 2201/10015* (2013.01)

(58) Field of Classification Search
CPC . H01L 2224/16225; H01L 2224/32225; H01L 2224/73204
See application file for complete search history.

(56) References Cited

U.S. PATENT DOCUMENTS

| | | | | |
|---|---|---|---|---|
| 7,978,478 | B2 * | 7/2011 | Inagaki | H01L 21/4857 361/763 |
| 8,116,066 | B2 * | 2/2012 | Inoue | H01L 23/5389 361/321.4 |
| 8,284,562 | B2 * | 10/2012 | Lee | H05K 1/185 174/262 |
| 8,420,954 | B2 * | 4/2013 | Lin | H05K 1/0203 174/15.1 |
| 8,693,209 | B2 * | 4/2014 | Mikado | H05K 1/185 174/250 |
| 8,742,553 | B2 * | 6/2014 | Ishida | H05K 1/0298 257/668 |
| 9,185,799 | B2 * | 11/2015 | Ishida | H05K 1/0306 |
| 9,232,657 | B2 * | 1/2016 | Kiwanami | H05K 1/185 |
| 9,241,409 | B2 * | 1/2016 | Otsubo | H05K 1/185 |
| 9,282,635 | B2 * | 3/2016 | Shimabe | H05K 1/0284 |
| 9,338,891 | B2 * | 5/2016 | Shimabe | H01L 23/49822 |
| 9,560,769 | B2 * | 1/2017 | Shimabe | H05K 1/032 |
| 9,627,308 | B2 * | 4/2017 | Kobayashi | H01L 23/49827 |
| 9,627,309 | B2 * | 4/2017 | Kobayashi | H01L 23/49838 |
| 2011/0240354 | A1 | 10/2011 | Furuhata et al. | |
| 2012/0186861 | A1 * | 7/2012 | Shimizu | H01L 23/5389 174/255 |
| 2013/0122658 | A1 * | 5/2013 | Savic | H01L 23/24 438/126 |
| 2014/0116763 | A1 * | 5/2014 | Sato | H05K 1/186 174/258 |
| 2014/0144686 | A1 * | 5/2014 | Shimizu | H05K 1/185 174/258 |
| 2015/0245492 | A1 | 8/2015 | Shimabe et al. | |
| 2016/0157354 | A1 * | 6/2016 | Tago | H05K 1/0298 361/763 |
| 2016/0322289 | A1 * | 11/2016 | Kobayashi | H01L 23/49822 |
| 2016/0322294 | A1 * | 11/2016 | Kobayashi | H01L 23/49822 |
| 2016/0322295 | A1 * | 11/2016 | Kobayashi | H01L 23/49838 |

FOREIGN PATENT DOCUMENTS

| | | | | |
|---|---|---|---|---|
| JP | | 2015-159153 | 9/2015 | |
| WO | WO 2015083345 A1 * | | 6/2015 | ........... H05K 1/0231 |

* cited by examiner

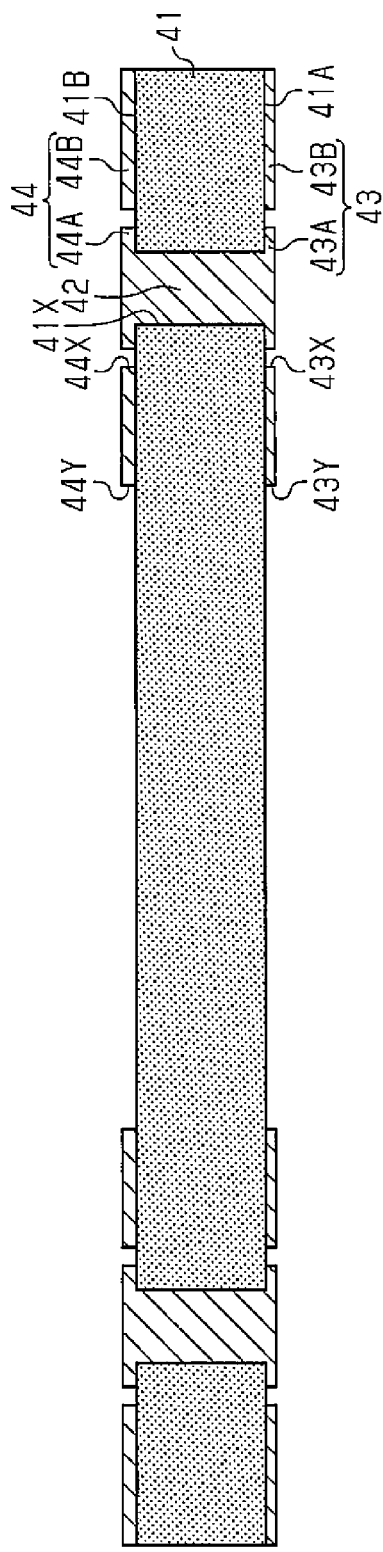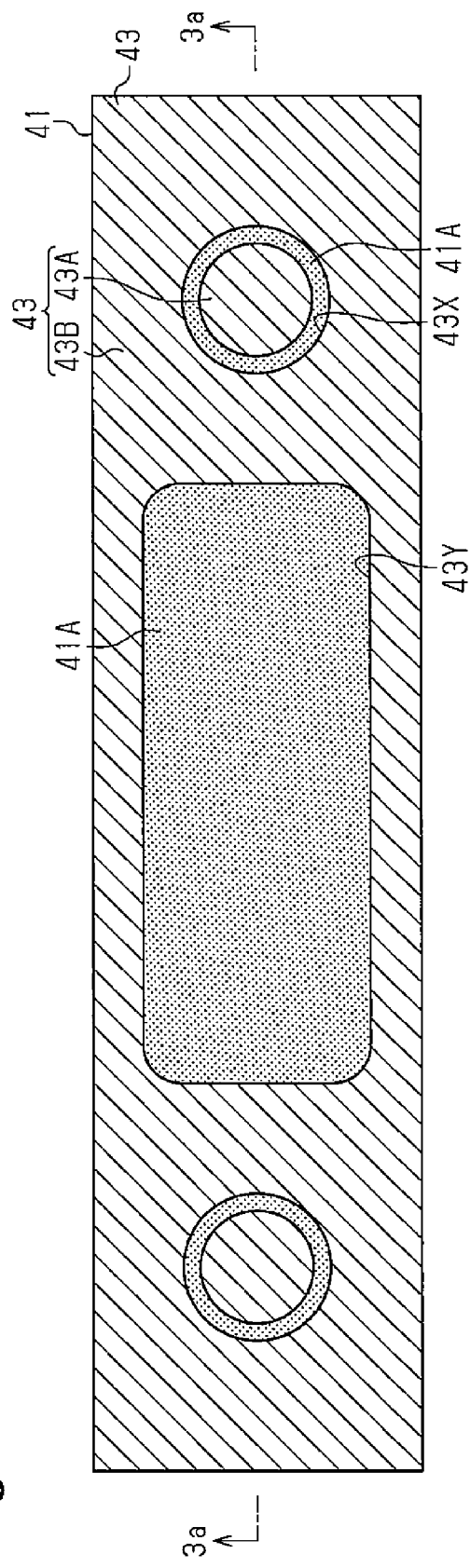

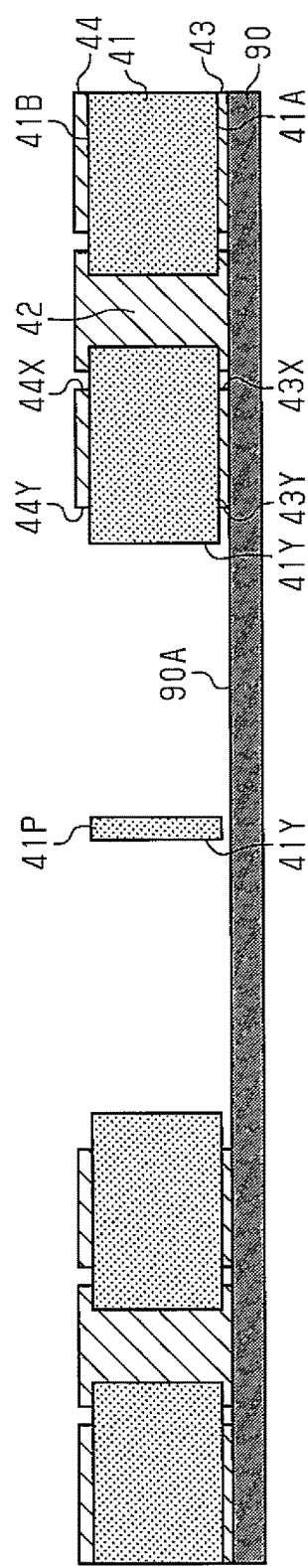
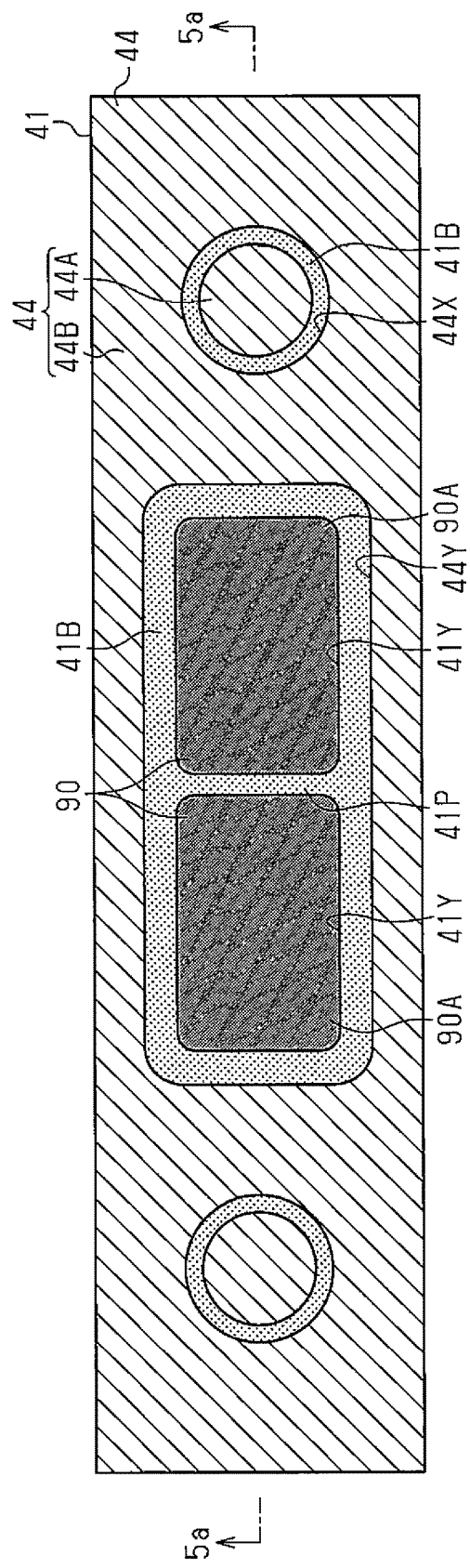
Fig.5A
Fig.5B

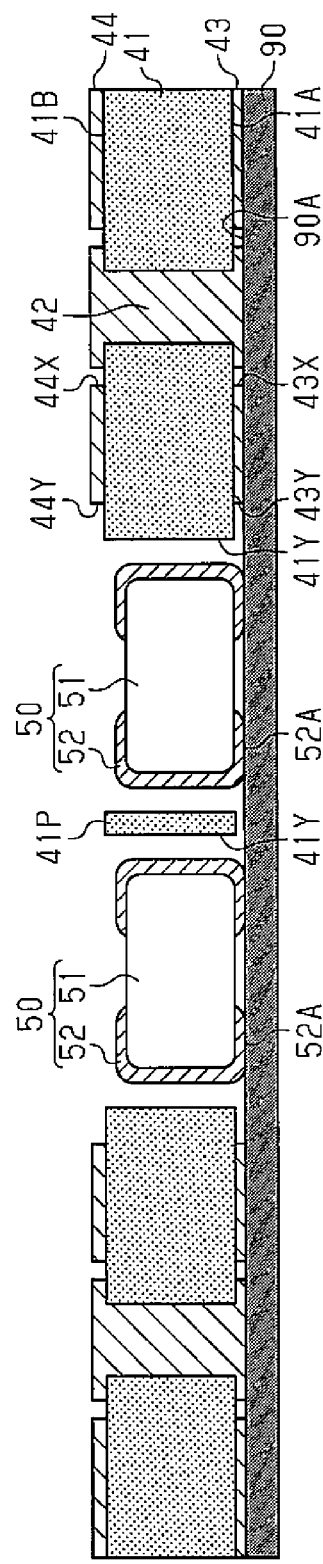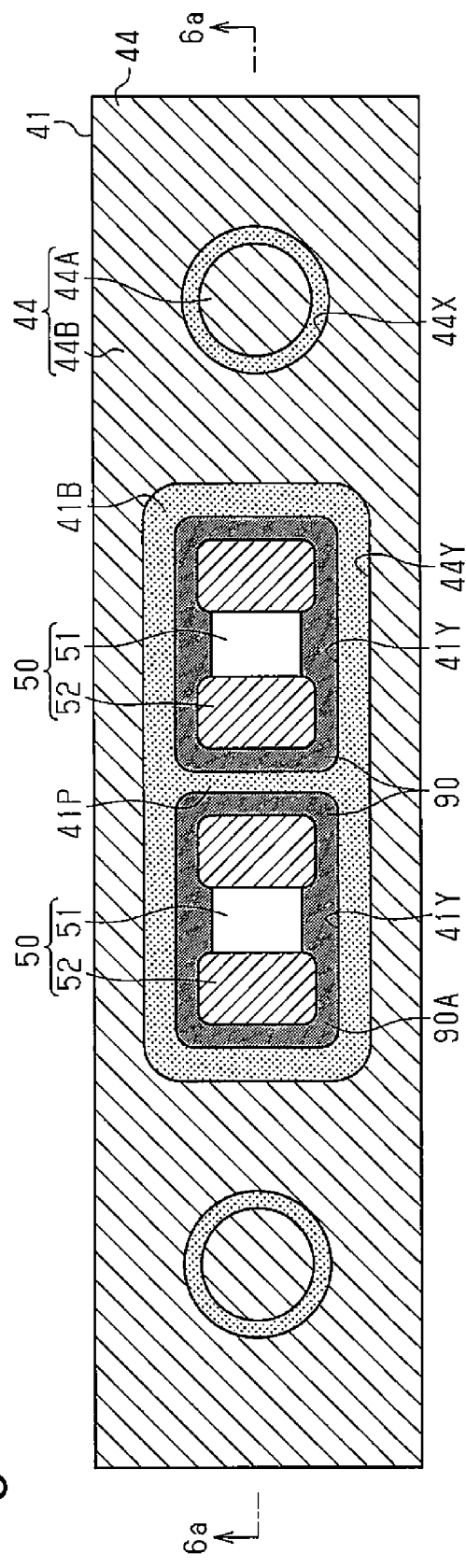

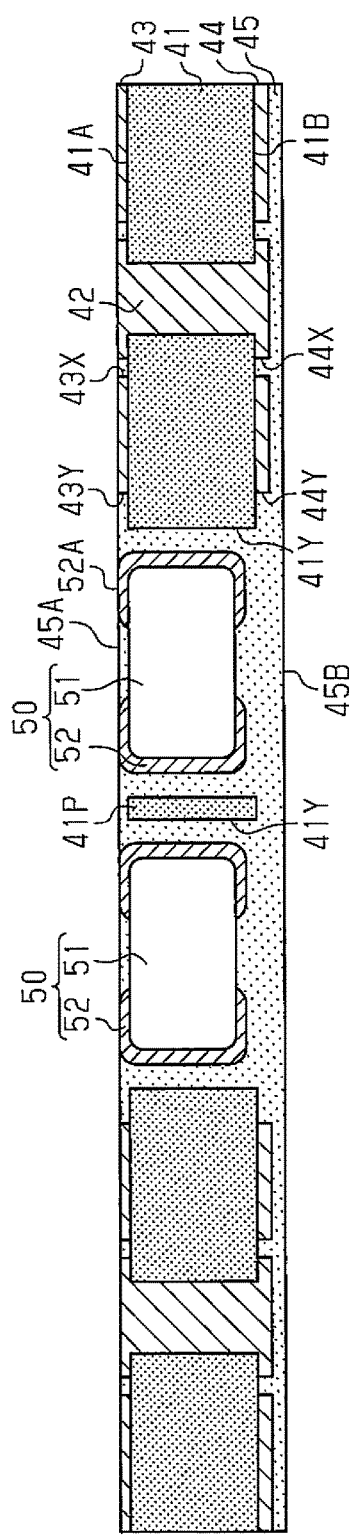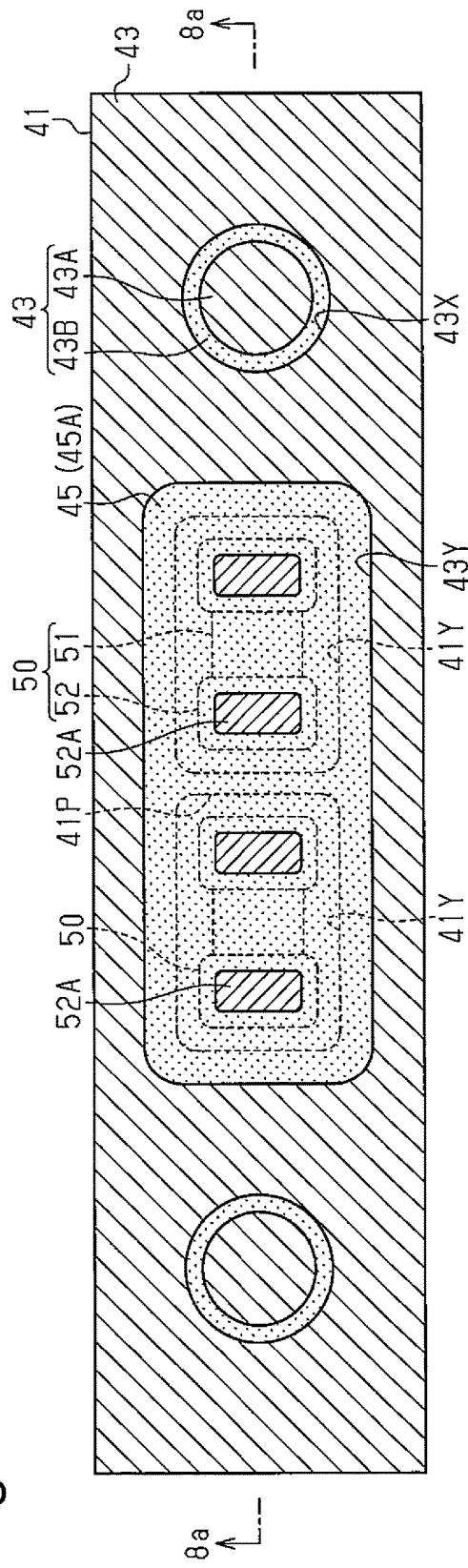
Fig.8A
Fig.8B

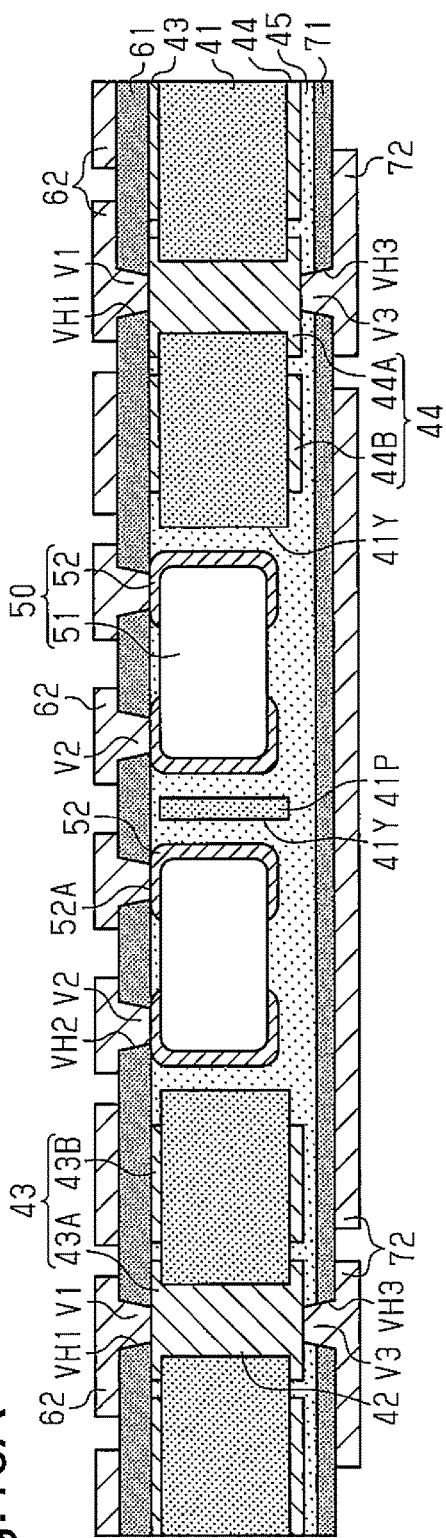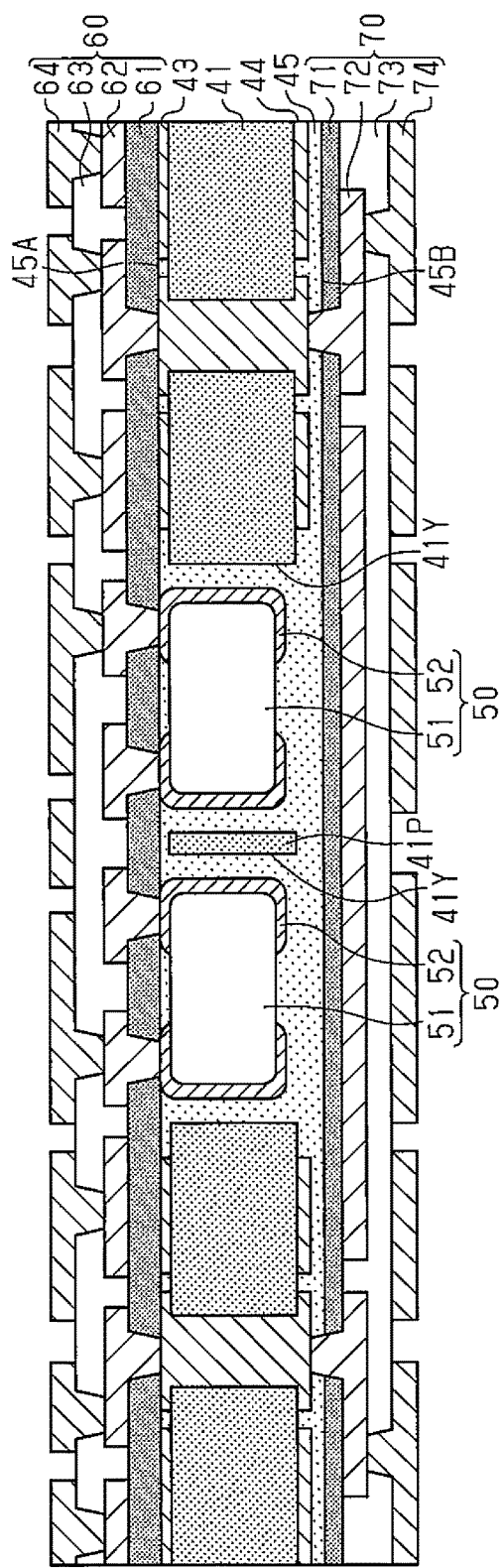

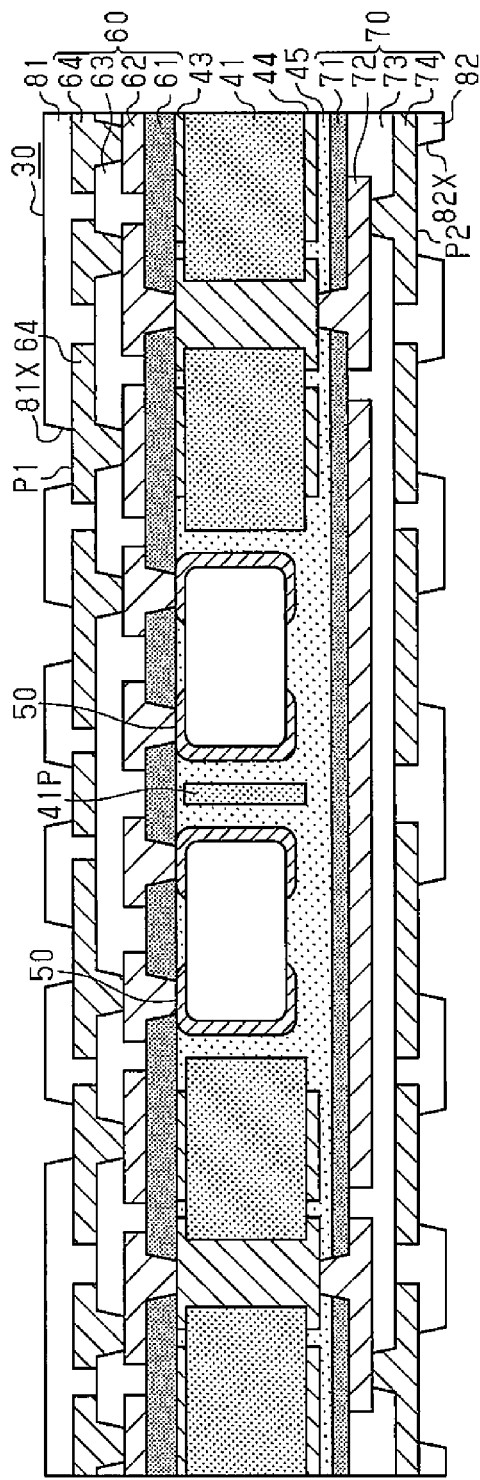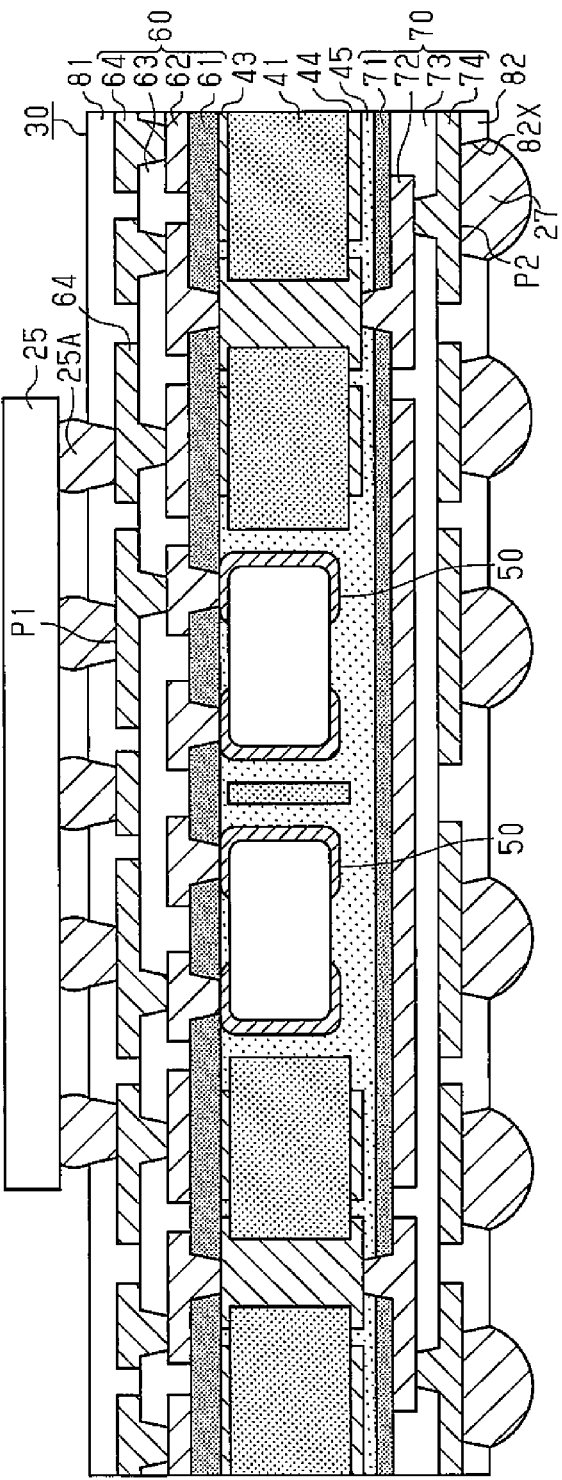

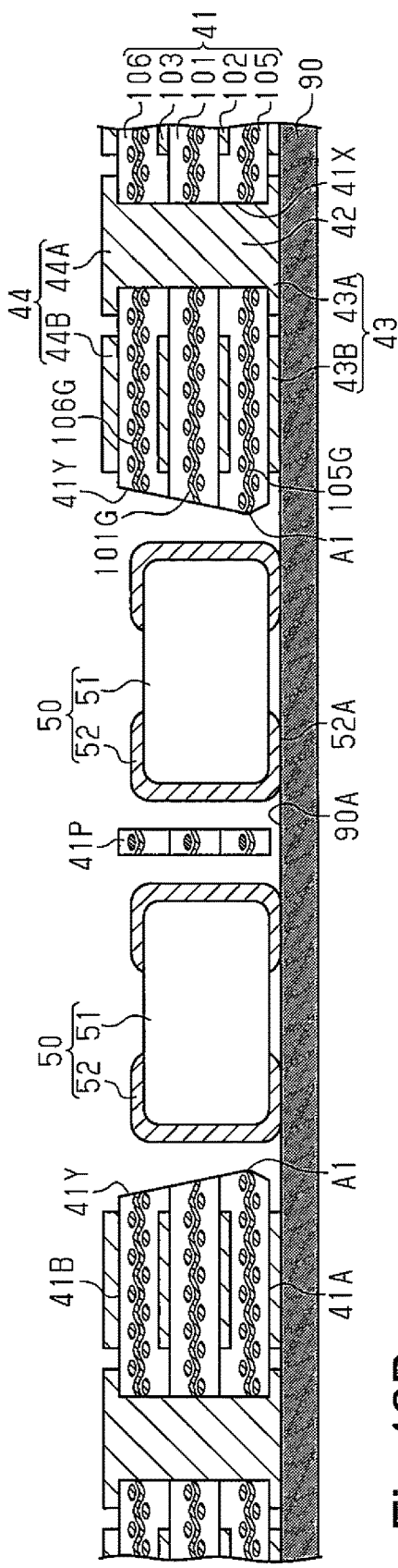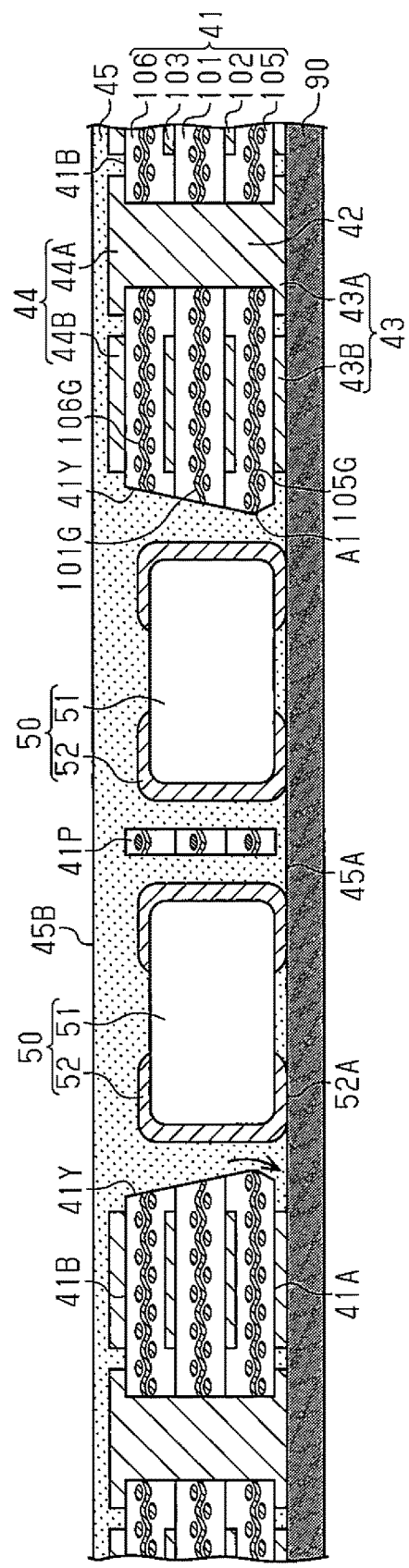

(Comparative Example)

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2014-189223, filed on Sep. 17, 2014, the entire contents of which are incorporated herein by reference.

FIELD

This disclosure relates to a wiring substrate, a semiconductor device, and a method for manufacturing the wiring substrate.

BACKGROUND

Japanese Laid-Open Patent Publication No. 2011-216740 describes a wiring substrate incorporating an electronic component such as a chip capacitor, which is a chip type capacitive element. The wiring substrate includes a core substrate, and the electronic component is arranged in a bore or cavity extending through the core substrate. Such wiring substrate is obtained through the following steps. First, a bore that extends through both surfaces (first surface, second surface) of the core substrate and has a larger size than the electronic component is formed in the core substrate. Next, a temporary holding tape is attached to one surface (first surface) of the core substrate so as to close the bore. Next, the electronic component is arranged in the bore, and the bore is filled with an insulating resin to form an insulating layer on a surface (second surface) of the core substrate on which the tape is not attached. The tape is then removed, and an insulating layer is formed on the surface (first surface) of the core substrate on which the tape was attached. Then, a predetermined number of insulating layers and wiring layers are stacked on each insulating layer.

SUMMARY

When arranging a plurality of electronic components in a bore of the core substrate, the electronic components may be moved in a planar direction (direction parallel to both surfaces of core substrate) in the bore by the pressure of the insulating resin flowing into the bore when the bore is filled with the insulating resin. This may result in the electronic components contacting each other, and the electrodes of the electronic components may be short-circuited.

One aspect of this disclosure is a wiring substrate including a core, first and second wiring layers, electronic components, an insulating material, and first and second wiring structures. The core includes a first surface, a second surface located at a side opposite to the first surface, and a plurality of electronic component accommodating bores that extend through the core in a thickness direction between the first surface and the second surface. The first wiring layer is formed on the first surface of the core. The first wiring layer includes a first opening that extends through the first wiring layer in the thickness direction. The second wiring layer is formed on the second surface of the core. The second wiring layer includes a second opening that extends through the second wiring layer in the thickness direction. Each of the electronic components is arranged in one of the electronic component accommodating bores. The insulating material covers the first surface and the second surface of the core. The electronic component accommodating bores are filled with the insulating material. The first wiring structure is formed on a first surface side of the core. The second wiring structure is formed on a second surface side of the core. The electronic component accommodating bores extend through the core at portions exposed from the first opening of the first wiring layer and the second opening of the second wiring layer. The core further includes a partition located between adjacent ones of the electronic component accommodating bores. The partition is formed by part of the core.

BRIEF DESCRIPTION OF THE DRAWINGS

The invention, together with objects and advantages thereof, may best be understood by reference to the following description of the presently preferred embodiments together with the accompanying drawings in which:

FIG. 3A is a schematic cross-sectional view illustrating a method for manufacturing a wiring substrate used in the semiconductor device of FIG. 1 (cross-sectional view taken along line 3a-3a in FIG. 3B);

FIG. 3B is a schematic plan view illustrating the method for manufacturing the wiring substrate;

FIG. 5A is a schematic cross-sectional view illustrating the method for manufacturing a wiring substrate (cross-sectional view taken along line 5a-5a in FIG. 5B);

FIG. 5B is a schematic plan view illustrating the method for manufacturing the wiring substrate;

FIG. 6A is a schematic cross-sectional view illustrating the method for manufacturing a wiring substrate (cross-sectional view taken along line 6a-6a in FIG. 6B);

FIG. 6B is a schematic plan view illustrating the method for manufacturing the wiring substrate;

FIG. 8A is a schematic cross-sectional view illustrating the method for manufacturing the wiring substrate (cross-sectional view taken along line 8a-8a in FIG. 8B);

FIG. 8B is a schematic plan view illustrating the method for manufacturing the wiring substrate;

FIGS. 10A, 10B, and 11A are schematic cross-sectional views illustrating the method for manufacturing the wiring substrate;

FIG. 11B is a schematic cross-sectional view illustrating the method for manufacturing the semiconductor device of FIG. 1;

FIGS. 12A and 12B are schematic cross-sectional views illustrating a method for manufacturing a wiring substrate in a modified example;

FIGS. 14A to 14D are schematic views illustrating a method for manufacturing the wiring substrate in a further modified example, wherein FIG. 14A is a plan view, FIG. 14B is a cross-sectional view taken along line 14b-14b in FIG. 14A, FIG. 14C is a cross-sectional view taken along line 14c-14c in FIG. 14A, and FIG. 14D is a cross-sectional view taken along line 14d-14d in FIG. 14A, FIGS. 15A to 15C are schematic plan views illustrating various arrangement examples of the chip capacitor;

DESCRIPTION OF THE EMBODIMENTS

Figure 1:
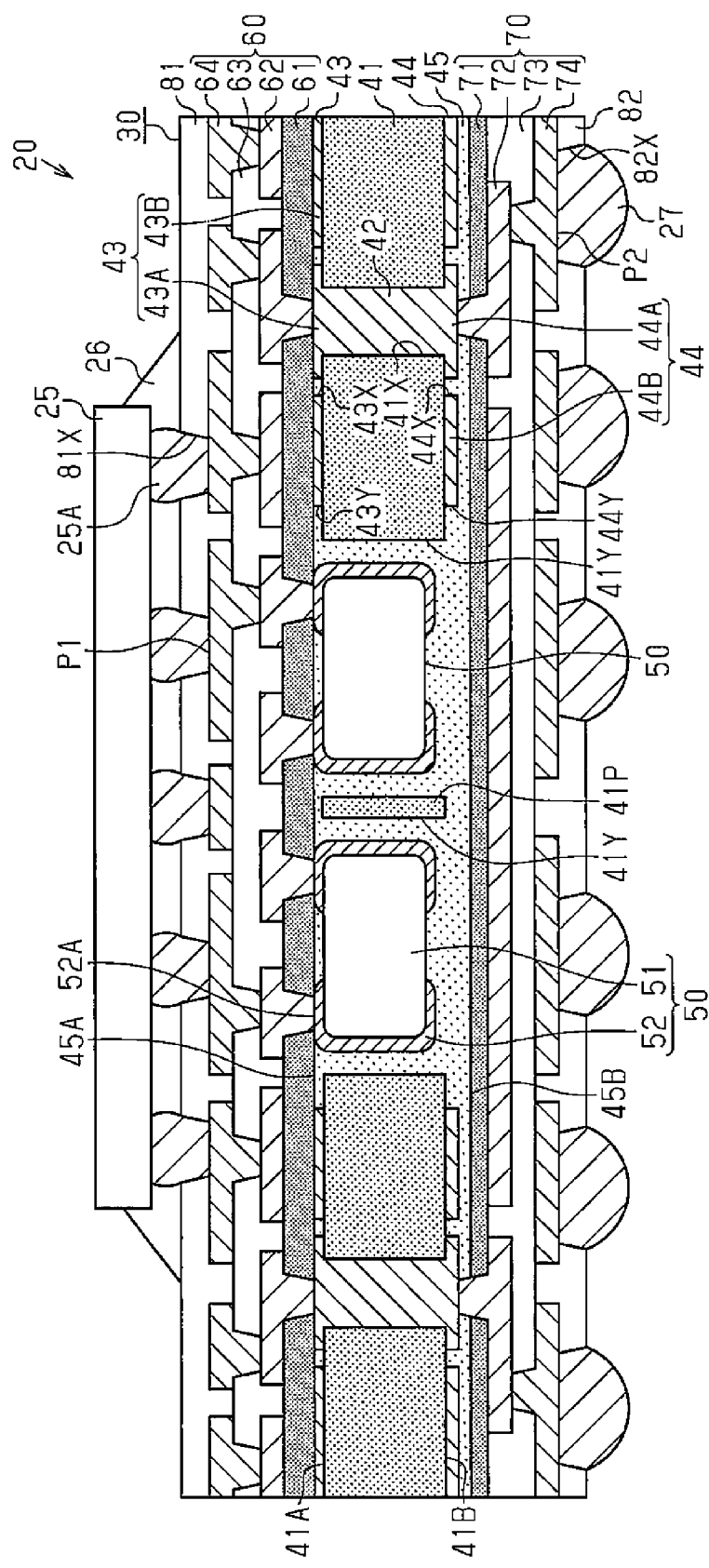
FIG. 1 is a schematic cross-sectional view illustrating one embodiment of a semiconductor device (cross-sectional view taken along line 1-1 in FIG. 2)

In the drawings, elements are illustrated for simplicity and clarity and have not necessarily been drawn to scale. To facilitate understanding, hatching lines may not be illustrated or be replaced by shadings in the cross-sectional drawings.

As illustrated in FIG. 1, a semiconductor device 20 includes a wiring substrate 30, a semiconductor element 25 mounted on the wiring substrate 30, an underfill resin 26 formed between the wiring substrate 30 and the semiconductor element 25, and an external connection terminal 27 formed on the wiring substrate 30.

The wiring substrate 30 includes a core 41, an insulating layer 45 that covers a first surface 41A (upper surface herein) and a second surface 41B (lower surface herein) of the core 41, and a plurality of chip capacitors 50 incorporated in the wiring substrate 30. The chip capacitor 50 serves as an example of an electronic component. The wiring substrate 30 includes a wiring structure 60 stacked on a first surface 45A (upper surface herein) of the insulating layer 45, a wiring structure 70 stacked on a second surface 45B (lower surface herein) of the insulating layer 45, a solder resist layer 81 stacked on the wiring structure 60, and a solder resist layer 82 stacked on the wiring structure 70.

A so-called glass epoxy substrate may be used as the core 41. The epoxy substrate is formed by impregnating a glass cloth (glass woven cloth), which is a reinforcement material, with a thermosetting insulating resin, the main component of which is an epoxy resin, and curing the insulating resin. The reinforcement material is not limited to a glass cloth, and for example, a glass unwoven cloth, an aramid woven cloth, an aramid unwoven cloth, a liquid crystal polymer (LCP) woven cloth, or an LCP unwoven cloth may be used. The thermosetting insulating resin is not limited to the epoxy resin and, for example, a resin material such as a polyimide resin and a cyanate resin may be used. The thickness of the core 41 is, for example, about 100 to 800 μm.

A plurality of through holes 41X extending through the core 41 in a thickness direction is formed at certain locations (two areas in FIG. 1) in the core 41. A through electrode 42 extending through the core 41 in the thickness direction is formed in each through hole 41X. For example, the through electrode 42 is filled with the through hole 41X. The through electrode 42 and the through hole 41X are formed, for example, to have a substantially circular shape in plan view.

A wiring layer 43 is formed on the first surface 41A of the core 41. The wiring layer 43 includes a wiring pattern 43A electrically connected to the through electrode 42, and a wiring pattern 43B formed in a solid form on the first surface 41A of the core 41. The wiring pattern 43B is, for example, a plane layer such as a power supply plane, a GND plane, and the like. The thickness of the wiring layer 43 (wiring patterns 43A, 43B) may be, for example, about 25 to 30 μm.

Figure 2:
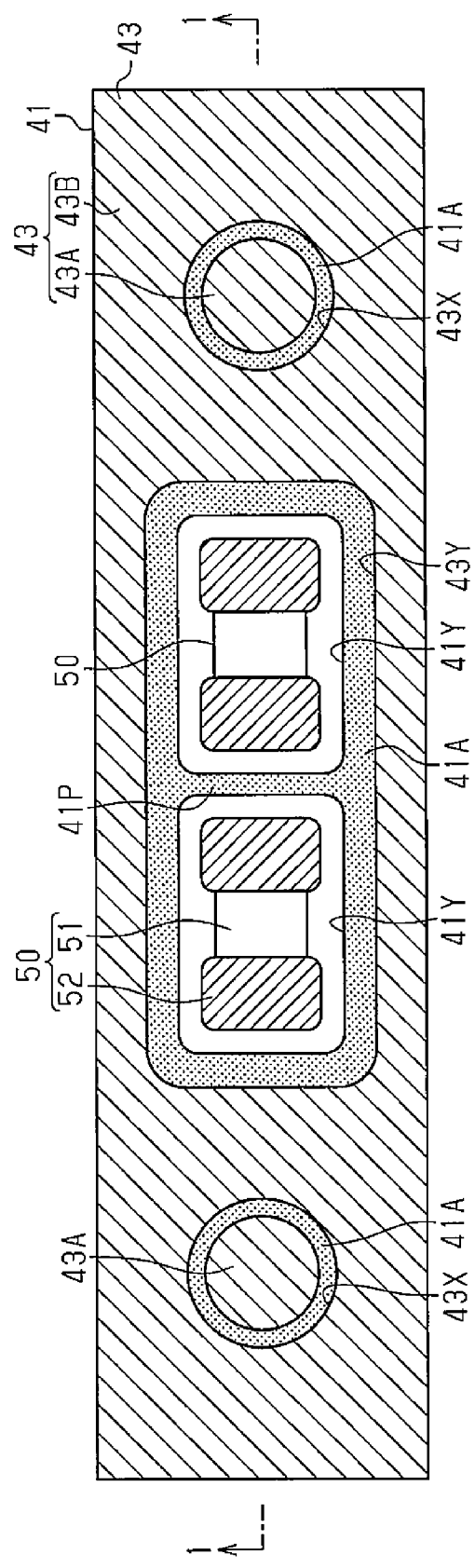
FIG. 2 is a schematic plan view illustrating a portion of the semiconductor device of FIG. 1.

As illustrated in FIG. 2, the wiring pattern 43A is formed, for example, to a substantially circular shape in plan view. The diameter of the wiring pattern 43A is, for example, about 100 to 150 μm. The wiring layer 43 includes a through hole 43X (two herein) that separates the wiring pattern 43A and the wiring pattern 43B. In other words, the wiring pattern 43A is defined by the through hole 43X. The through hole 43X is, for example, formed to have a substantially circular ring shape in plan view. An opening 43Y is formed in a substantially central part in plan view of the wiring layer 43 (wiring pattern 43B). The opening 43Y is formed, for example, to have a substantially rectangular shape in plan view. The through hole 43X and the opening 43Y respectively extend through the wiring layer 43 in the thickness direction and expose the first surface 41A of the core 41. FIG. 2 is a schematic plan view illustrating the core 41, the wiring layer 43, and the chip capacitor 50 as viewed from the upper side of FIG. 1. FIG. 1 is a schematic cross-sectional view of the semiconductor device 20 taken along line 1-1 of FIG. 2.

As illustrated in FIG. 1, a wiring layer 44 is formed on the second surface 41B of the core 41. The wiring layer 44 includes a wiring pattern 44A electrically connected to the through electrode 42, and a wiring pattern 44B formed in a solid form on the second surface 41B of the core 41. Thus, the wiring patterns 43A, 44A are electrically connected to each other by the through electrode 42. The wiring pattern 44B is, for example, a plane layer such as a power supply plane, a GND plane, and the like. The thickness of the wiring layer 44 (wiring patterns 44A, 44B) is, for example, set to be thicker than the wiring layer 43 (wiring patterns 43A, 43B). For example, the thickness of the wiring layer 44 may be about 35 to 40 μm.

In the same manner as the wiring pattern 43A, for example, the wiring pattern 44A is formed to have a substantially circular shape in plan view. The diameter of the wiring pattern 44A is, for example, about 100 to 150 μm. In the same manner as the through hole 43X of the wiring layer 43, the wiring layer 44 includes a through hole 44X that separates the wiring pattern 44A and the wiring pattern 44B. Furthermore, in the same manner as the opening 43Y of the wiring layer 43, an opening 44Y is formed in a substantially central part in plan view of the wiring layer 44 (wiring pattern 44B). The opening 44Y substantially overlaps the opening 43Y in plan view. Copper and copper alloy, for example, can be used as the material of the through electrode 42 and the wiring layers 43, 44.

A bore 41Y, the number (two herein) of which is same as the number of chip capacitors 50 incorporated in the wiring substrate 30, is formed in the core 41. Each bore 41Y serves as an electronic component accommodating bore. As illustrated in FIG. 2, two bores 41Y are formed in the core 41 of the portion exposed from the openings 43Y, 44Y of the wiring layers 43, 44. In other words, the two bores 41Y are formed at positions overlapping part of the openings 43Y, 44Y in plan view, and are communicated with the openings 43Y, 44Y. The periphery of the two bores 41Y is surrounded only by the core 41 (insulating resin) in plan view. Thus, only a partition 41P configured only by the core 41 exists between the two adjacent bores 41Y. Accordingly, two bores 41Y partitioned (isolated) by the partition 41P of the core 41 are located in one opening 43Y formed in the wiring layer 43 (or one opening 44Y formed in the wiring layer 44). In other words, a plurality of bores 41Y for a plurality of chip capacitors 50 is arranged separated from one another in one opening 43Y of the wiring layer 43 (or one opening 44Y of the wiring layer 44). Each bore 41Y extends through the core 41 in the thickness direction.

The planar shape of each bore 41Y is, for example, a substantially rectangular shape, and is greater than the planar shape of each chip capacitor 50. For example, the size of each bore 41Y is about 0.7 mm×0.4 mm to 15 mm×15 mm in plan view.

Each chip capacitor 50 is arranged individually in the corresponding bore 41Y. In other words, one chip capacitor 50 is arranged in each bore 41Y. Thus the partition 41P is arranged between the two chip capacitors 50 arranged in the two bores 41Y.

Each chip capacitor 50 includes a capacitor main body 51, which is box-shaped, and two connection terminals 52, which are formed on the two longitudinal ends of the capacitor main body 51. Each connection terminal 52 covers a side surface of the corresponding end of the capacitor main body 51. Each connection terminal 52 also partially covers the upper and lower surfaces of the capacitor main body 51. The thickness of the chip capacitor 50 is, for example, about 100 to 500 µm. The capacitor main body 51 is formed by an electrode mainly including, for example, ceramic, copper and the like. Copper and copper alloy, for example, can be used as the material of the connection terminal 52.

As illustrated in FIG. 1, one part of each chip capacitor 50 is located in the opening 43Y while projecting upward from the bore 41Y. In the present example, a first surface 52A (upper surface herein) of each connection terminal 52 is flush with the first surface (upper surface herein) of the wiring layer 43.

The bore 41Y is filled with the insulating layer 45. The through hole 43X and the opening 43Y are also filled with the insulating layer 45. Therefore, the insulating layer 45 covers the entire side surface of the wiring layer 43, and also covers the entire first surface 41A of the core 41 exposed from the through hole 43X and the opening 43Y of the wiring layer 43. The insulating layer 45 also covers part of the chip capacitor 50. For example, the insulating layer 45 covers the second surface (lower surface herein) and the side surface of each connection terminal 52, and the entire surface of the capacitor main body 51 exposed from the connection terminals 52. Therefore, in the present example, the chip capacitor 50 has only the first surface 52A of the connection terminal 52 exposed from the first surface 45A of the insulating layer 45. In other words, in the chip capacitor 50, the connection terminal 52 is buried in the insulating layer 45 except for the first surface 52A. Thus, the first surface 45A of the insulating layer 45, the first surface 52A of each connection terminal 52, and the first surface (that is, upper surface) of the wiring layer 43 are formed to be substantially flush with one another. The insulating layer 45 covers the entire partition 41P, that is, the entire side surface, the entire upper surface, and the entire lower surface of the partition 41P. Furthermore, the insulating layer 45 covers the entire second surface 41B of the core 41 exposed from the through hole 44X and the opening 44Y of the wiring layer 44, and covers the entire side surface and the entire second surface (lower surface herein) of the wiring layer 44. An insulating resin such as epoxy resin, polyimide resin, and the like, for example, can be used as the material of the insulating layer 45.

The wiring structure 60 is stacked on the first surface 45A of the insulating layer 45. The wiring structure 60 has a structure in which the wiring layer and the inter-layer insulating layer are alternately stacked. There may be any number of wiring layers. The inter-layer insulating layer merely needs to have a film thickness at which the wiring layers are insulated from each other. In the present example, the wiring structure 60 has a structure in which an inter-layer insulating layer 61, a wiring layer 62, an inter-layer insulating layer 63, and a wiring layer 64 are stacked in order on the first surface 45A of the insulating layer 45. For example, an insulating resin such as epoxy resin, polyimide resin, and the like, and a resin material obtained by mixing a filler such as silica, alumina, and the like in the insulating resin can be used as the material of the inter-layer insulating layers 61, 63. Copper and copper alloy, for example, can be used as the material of the wiring layers 62, 64.

The inter-layer insulating layer 61 covers the first surface 45A of the insulating layer 45, the first surface (upper surface) of the wiring layer 43, and the first surface 52A of each connection terminal 52. The wiring layer 62 is electrically connected to the wiring layer 43 or the connection terminal 52 through a via wiring that extends through the inter-layer insulating layer 61. The inter-layer insulating layer 63 is formed on the inter-layer insulating layer 61 so as to cover the wiring layer 62. The outermost (uppermost herein) wiring layer 64 is electrically connected to the wiring layer 62 through a via wiring that extends through the inter-layer insulating layer 63.

A solder resist layer 81 is stacked on the first surface (upper surface herein) of the outermost (uppermost herein) inter-layer insulating layer 63. The solder resist layer 81 includes an opening 81X that exposes part of the first surface (upper surface herein) of the uppermost wiring layer 64 as a pad P1. A bump 25A of the semiconductor element 25 is flip-chip joined to the pad P1. In other words, a surface of the wiring substrate 30 on the side the pad P1 is formed serves as a semiconductor element mounting surface. An insulating resin such as epoxy resin, acryl resin, and the like, for example, can be used as the material of the solder resist layer 81.

The wiring structure 70 is stacked on the second surface 45B of the insulating layer 45. The wiring structure 70 has a structure in which the wiring layer and the inter-layer insulating layer are alternately stacked. There may be any number of wiring layers. The inter-layer insulating layer merely needs to have a film thickness at which the wiring layers are insulated from each other. In the present example, the wiring structure 70 has a structure in which an inter-layer insulating layer 71, a wiring layer 72, an inter-layer insulating layer 73, and a wiring layer 74 are stacked in order on the second surface 45B of the insulating layer 45. For example, an insulating resin such as epoxy resin, polyimide resin, and the like, and a resin material obtained by mixing filler such as silica, alumina, and the like in such insulating resin can be used as the material of the inter-layer insulating layers 71, 73. Copper and copper alloy, for example, can be used as the material of the wiring layers 72, 74.

The inter-layer insulating layer 71 covers the entire second surface 45B of the insulating layer 45. The wiring layer 72 is electrically connected to the wiring layer 44 through a via wiring that extends through the inter-layer insulating layer 71 and the insulating layer 45. The inter-layer insulating layer 73 is formed on the inter-layer insulating layer 71 so as to cover the wiring layer 72. The outermost (lowermost herein) wiring layer 74 is electrically connected to the wiring layer 72 through a via wiring that extends through the inter-layer insulating layer 73.

A solder resist layer 82 is stacked on the second surface (lower surface herein) of the outermost (lowermost herein) inter-layer insulating layer 73. The solder resist layer 82 includes an opening 82X that exposes part of the second surface (lower surface herein) of the lowermost wiring layer 74 as an external connection pad P2. An external connection terminal 27 such as a ball, a lead pin, and the like used when mounting the semiconductor device 20 on the mounting substrate such as a motherboard or the like is connected to the external connection pad P2. The external connection terminal 27 may be omitted, and the wiring layer 74 exposed from the opening 82X may be used as the external connection terminal.

The semiconductor element 25 is flip-chip mounted on the wiring substrate 30 having the structure described above. In other words, when the bump 25A arranged on a circuit forming surface (lower surface in FIG. 1) of the semiconductor element 25 is joined with the pad P1 of the wiring substrate 30, the semiconductor element 25 is electrically connected to the wiring layer 64 of the wiring substrate 30 by the bump 25A.

A logic chip such as a central processing unit (CPU) chip, and a memory chip such as a dynamic random access memory (DRAM) chip, for example, can be used as the semiconductor element 25. A gold bump and a solder bump, for example, can be used as the bump 25A.

The underfill resin 26 is arranged to fill a gap between the first surface (upper surface herein) of the wiring substrate 30 and the second surface (lower surface herein) of the semiconductor element 25. An insulating resin such as epoxy resin, and the like, for example, can be used as the material of the underfill resin 26.

A method for manufacturing the wiring substrate 30 will now be described.

First, in the step illustrated in FIG. 3A, a structure including the core 41, the wiring layer 43 formed on the first surface 41A (lower surface in FIG. 3A) of the core 41, and the wiring layer 44 formed on the second surface 41B (upper surface in FIG. 3A) of the core 41 is formed using a known technique. In the structure, part of the first surface 41A of the core 41 is exposed from the opening 43Y of the wiring layer 43, and part of the second surface 41B of the core 41 is exposed from the opening 44Y of the wiring layer 44. Specifically, as illustrated in FIG. 3B, the first surface 41A of the core 41 located at substantially the middle part in plan view is exposed from the opening 43Y having a substantially rectangular shape in plan view. In the same manner, the second surface 41B of the core 41 located at substantially the middle part in plan view is exposed from the opening 44Y having a substantially rectangular shape in plan view.

Figure 4A:
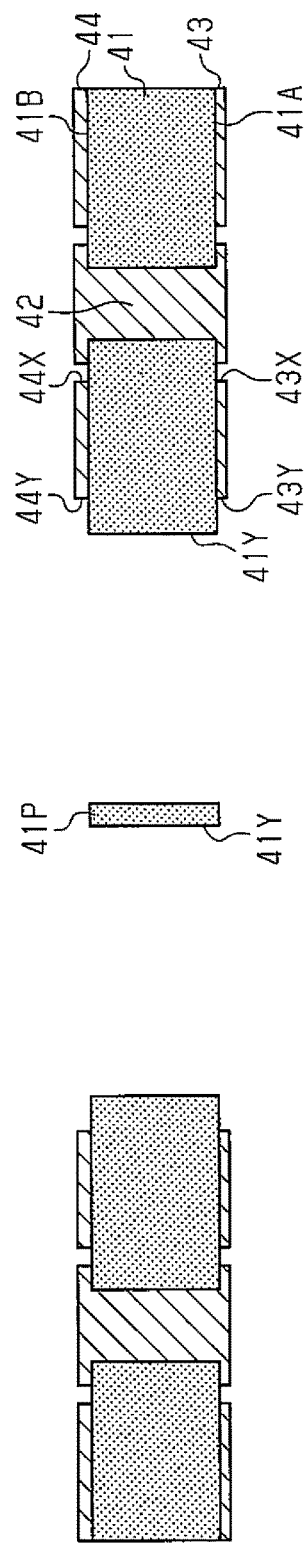
FIG. 4A is a schematic cross-sectional view illustrating the method for manufacturing the wiring substrate (cross-sectional view taken along line 4a-4a in FIG. 4B)
Figure 4B:
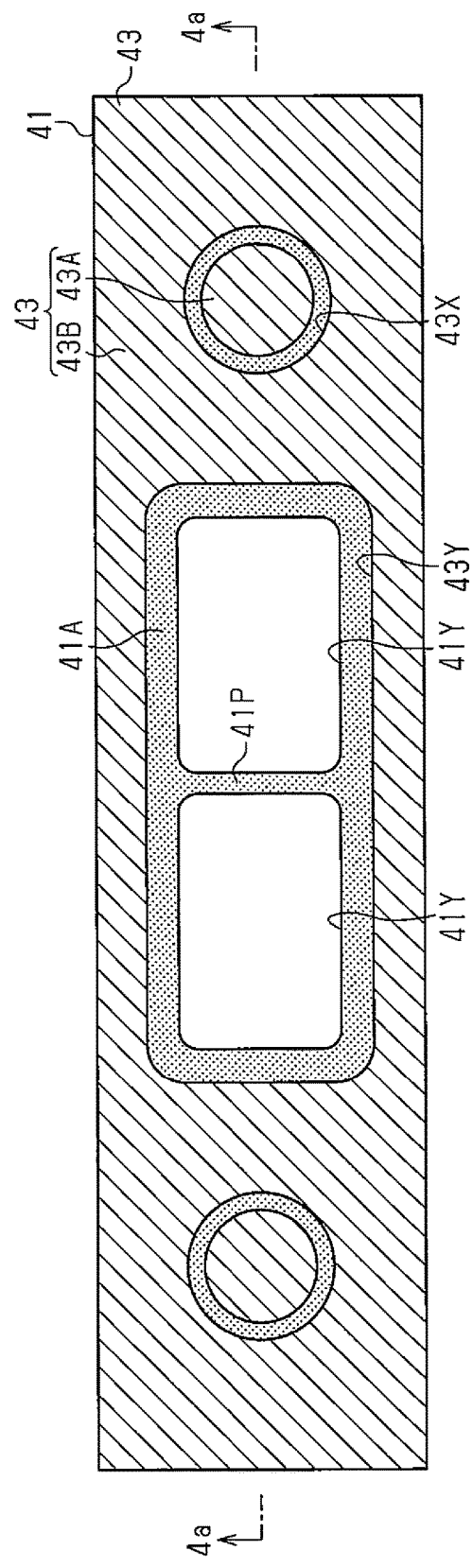
FIG. 4B is a schematic plan view illustrating the method for manufacturing the wiring substrate.

In the steps illustrated in FIGS. 4A and 4B, the bore 41Y, the number of which is the same as the number of the chip capacitors 50 incorporated in a subsequent step, is formed in the core 41 exposed from the openings 43Y, 44Y. In this case, the two adjacent bores 41Y are separated from each other by the partition 41P. In other words, the bores 41Y, which are isolated by the partition 41P, are separated from one another in a single opening 43Y (or single opening 44Y). The bore 41Y can be formed, for example, by a laser machine, a router, a die, a drill, or the like.

Then, in the step illustrated in FIG. 5A, an adhesive film 90 is attached to the first surface (lower surface in FIG. 5A) of the wiring layer 43. As a result, a gap corresponding to a thickness of the wiring layer 43 is formed between the first surface 41A of the core 41 (includes partition 41P) exposed from the wiring layer 43 and the upper surface 90A of the adhesive film 90. Furthermore, as illustrated in FIG. 5B, part of the upper surface 90A of the adhesive film 90 is exposed from the bore 41Y. A material having superior chemical resistance and heat resistance, for example, can be used as the material of the adhesive film 90. A polyethylene terephthalate (PET) film including an adhesive layer can be used.

In the steps illustrated in FIGS. 6A and 6B, the chip capacitors 50 are mounted one at a time on the adhesive film 90 exposed from each bore 41Y using a mount. Thus, each chip capacitor 50 is arranged in different bores 41Y. In this case, each chip capacitor 50 is fixed such that the first surface 52A of the connection terminal 52 contacts the upper surface 90A of the adhesive film 90.

Figure 7A:
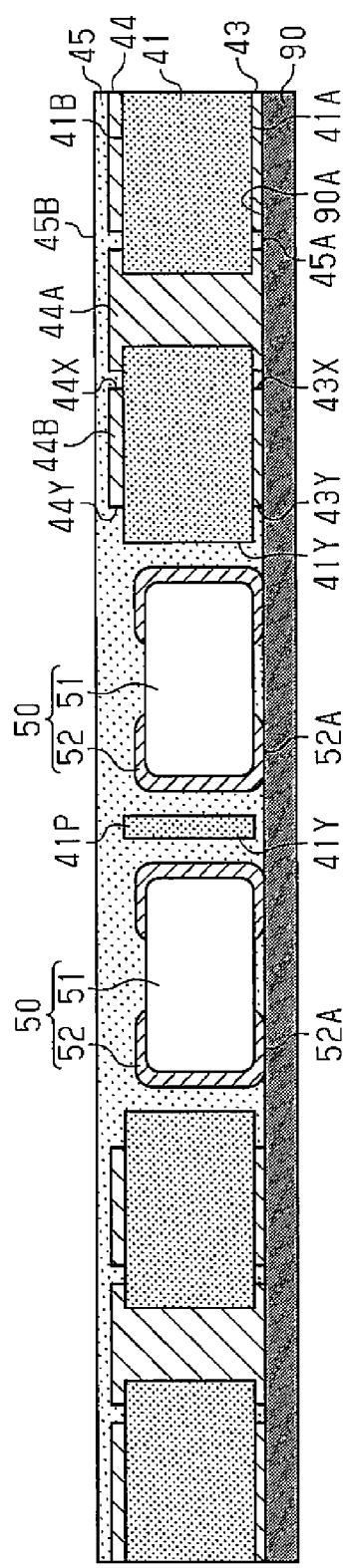
FIG. 7A is a schematic cross-sectional view illustrating the method for manufacturing the wiring substrate (cross-sectional view taken along line 7a-7a in FIG. 7B)
Figure 7B:
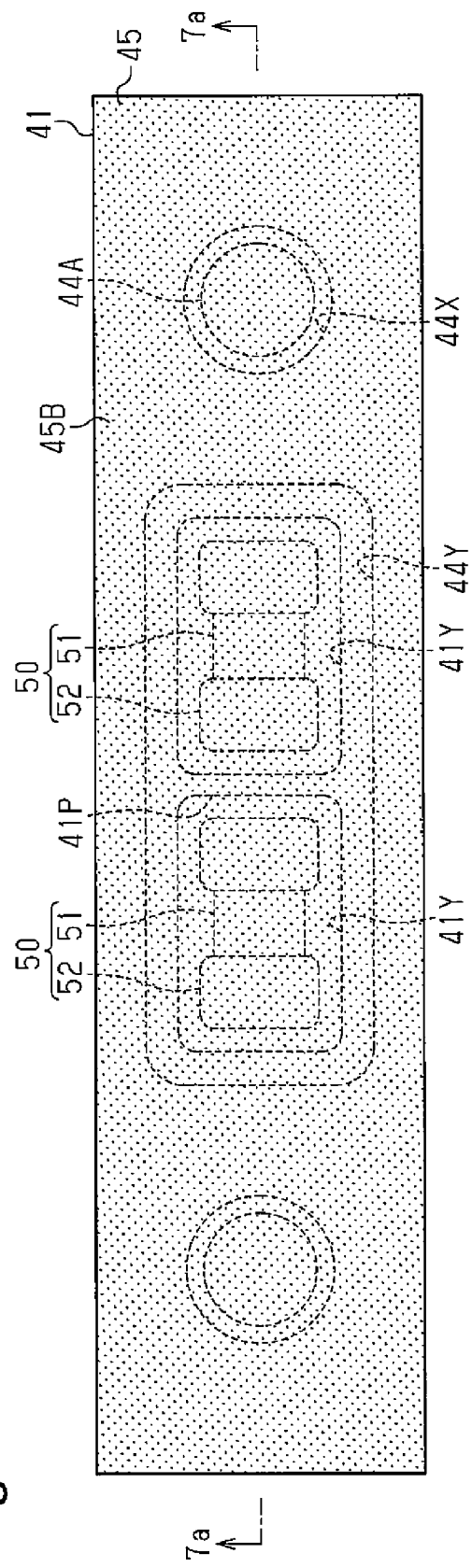
FIG. 7B is a schematic plan view illustrating the method for manufacturing the wiring substrate.

In the step illustrated in FIG. 7A, the insulating layer 45 is formed in the openings 43Y, 44Y, the bores 41Y, and the through holes 43X, 44X covering the upper surface 90A of the adhesive film 90 and the entire second surface (upper surface in FIG. 7A) of the wiring layer 44. Thus, the entire second surface 41B of the core 41, and the entire side surface and the entire second surface of the wiring layer 44 are covered by the insulating layer 45. Furthermore, most of the chip capacitor 50 is covered by the insulating layer 45. In other words, as illustrated in FIG. 7B, all surfaces other than the surface to which the adhesive film 90 is attached are covered by the insulating layer 45 in the chip capacitor 50.

For example, the insulating layer 45 can be formed through the following processes. First, a sheet-like insulating resin material in a half-cured state (B-stage) is stacked on the wiring layer 44 so as to close the bores 41Y. Then, the insulating resin is heated and pressurized under a depressurized atmosphere (e.g., in vacuum), and the insulating resin in the bore 41Y is cured. In this case, the chip capacitor 50 may be moved in a planar direction (up and down, left and right direction in FIG. 7B, that is, direction orthogonal to thickness direction in cross-sectional view) in the bore 41Y by the pressure of the insulating resin filled into the bore 41Y. In the present example, however, each chip capacitor 50 is individually arranged in the bores 41Y isolated by the partition 41P, and thus the partition 41P exists between the adjacent chip capacitors 50. Thus, even if the chip capacitor 50 is moved in the planar direction, the chip capacitor 50 contacts only the partition 41P, and the adjacent chip capacitors 50 do not contact each other. As illustrated in FIG. 7A, a gap is formed between the first surface (lower surface in FIG. 7A) of the partition 41P and the upper surface 90A of the adhesive film 90. Thus, two bores 41Y are communicated through the gap, and the insulating resin that flows into one bore 41Y spreads to the other bore 41Y through the gap. This improves the fluidity of the insulating resin arranged in the two bores 41Y. For example, epoxy resin and polyimide resin can be used as the insulating resin material described above.

In the steps described above, the insulating layer 45 is adhered to the core 41 and the chip capacitor 50, and the insulating layer 45, the core 41, and the chip capacitor 50 are integrated.

In the steps illustrated in FIGS. 8A and 8B, the adhesive film 90 illustrated in FIG. 7A is removed. The portion contacting the adhesive film 90, that is, the first surface 45A of the insulating layer 45, part of the first surface 52A of each connection terminal 52, and the first surface (upper surface in FIG. 8A) of the wiring layer 43 are exposed. In this case, the first surface 45A of the insulating layer 45, the first surface 52A of each connection terminal 52, and the first surface (upper surface) of the wiring layer 43 are formed to a shape lying along the upper surface 90A (flat surface) of the adhesive film 90. Thus, the first surface 45A of the insulating layer 45, the first surface 52A of each connection terminal 52, and the first surface (upper surface) of the wiring layer 43 are substantially flush with each other. The structure illustrated in FIG. 8A is reversed upside down from the structure illustrated in FIG. 7A.

Figure 9A:
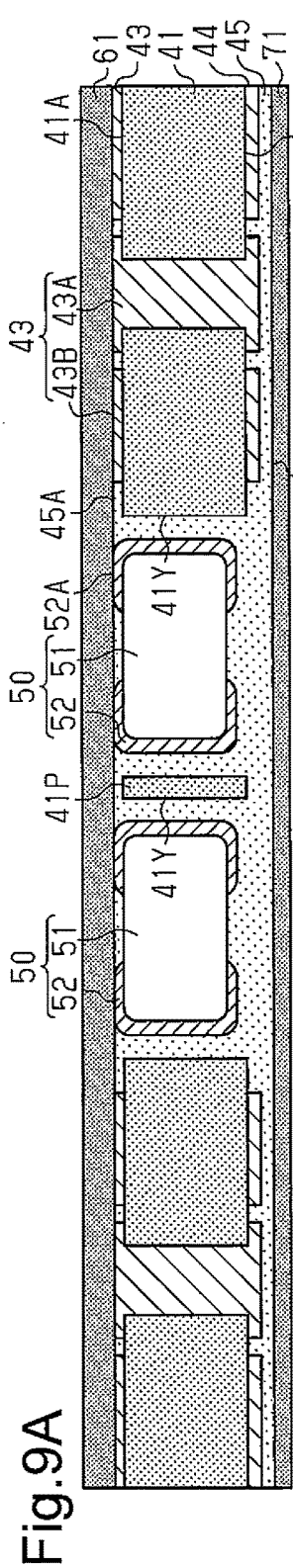
FIG. 9A is a schematic cross-sectional view illustrating the method for manufacturing the wiring substrate.

In the step illustrated in FIG. 9A, the inter-layer insulating layer 61 that covers the first surface 45A of the insulating layer 45, the first surface 52A of each connection terminal 52, and the first surface (upper surface) of the wiring layer 43 is formed on the first surface 45A of the insulating layer 45. Furthermore, the inter-layer insulating layer 71 that covers the entire second surface 45B of the insulating layer 45 is formed. The inter-layer insulating layers 61, 71 can be formed, for example, in a vacuum laminating process or a vacuum pressing process. A sheet-like insulating material in a half-cured state including epoxy resin, polyimide resin, and the like, for example, can be used as the material of the inter-layer insulating layers 61, 71.

In the step illustrated in FIG. 9A, the thicknesses of the inter-layer insulating layer 61, 71 are set so that the thickness from the first surface (upper surface in FIG. 9A) of the wiring layer 43 to the first surface (upper surface in FIG. 9A) of the inter-layer insulating layer 61 becomes equal to the thickness from the second surface (lower surface in FIG. 9A) of the wiring layer 44 to the second surface (lower surface in FIG. 9A) of the inter-layer insulating layer 71. The handling properties may be improved when forming a plurality of wiring layers in a subsequent step by setting the thicknesses of the inter-layer insulating layers 61, 71 in such a manner.

Figure 9B:
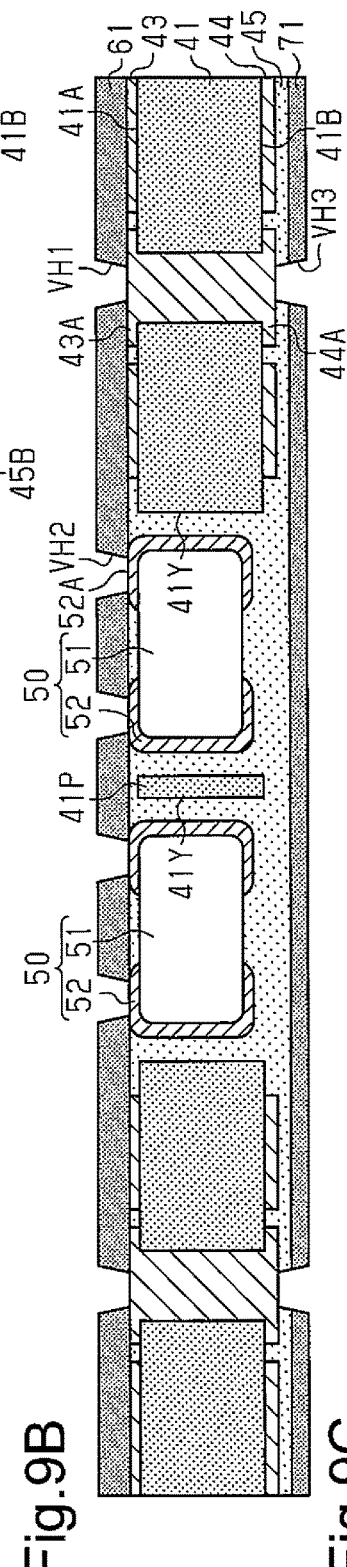
FIG. 9B is a schematic cross-sectional view illustrating the method for manufacturing the wiring substrate (cross-sectional view taken along line 9b-9b in FIG. 9C)
Figure 9C:
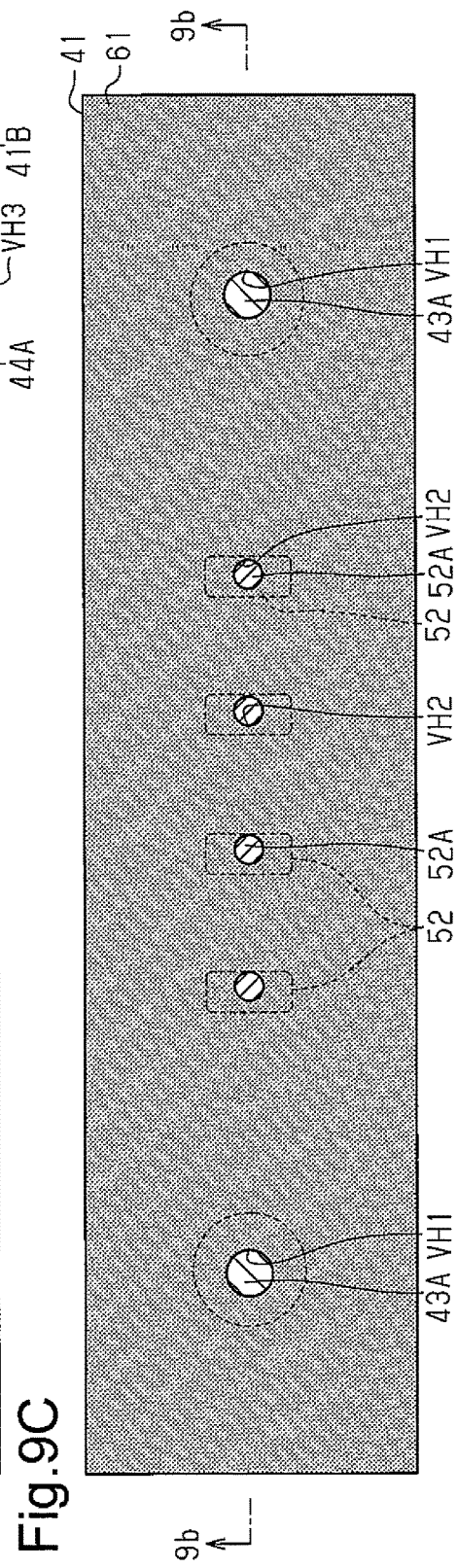
FIG. 9C is a schematic plan view illustrating the method for manufacturing the wiring substrate.

In the step illustrated in FIG. 9B, via holes VH1, VH2 are formed at the certain locations of the inter-layer insulating layer 61. Each via hole VH1 exposes part of the first surface (upper surface) of the wiring layer 43 (wiring pattern 43A), and each via hole VH2 exposes part of the first surface 52A of the corresponding connection terminal 52 (see broken line in FIG. 9C). In the step illustrated in FIG. 9B, a via hole VH3 extending through both of the inter-layer insulating layer 71 and the insulating layer 45 in the thickness direction is formed. Each via hole VH3 exposes part of the second surface (lower surface) of the wiring layer 44 (wiring pattern 44A). In the step of FIG. 9B, each via hole VH2 is formed in the first surface 52A of the corresponding connection terminal 52. Even if the chip capacitor 50 is moved in the planar direction when forming the insulating layer 45, for example, the displaced amount from the designed mounting position of each chip capacitor 50 is restricted by the partition 41P. This limits the formation of each via hole VH2 at a position deviated from the first surface 52A of the corresponding connection terminal 52 in the step of FIG. 9B.

The via holes VH1 to VH3 can be formed by laser machine using a $CO_2$ laser, the UV-YAG laser, and the like, for example. When the inter-layer insulating layers 61, 71 are formed using the photosensitive resin, for example, the via holes VH1 to VH3 may be formed through a photolithography process.

Subsequently, when the via holes VH1 to VH3 are formed by a laser machine, a desmear process is performed to remove the resin smear from the exposed surfaces of the wiring layers 43, 44 and the exposed surface of the connection terminal 52 at the bottom of the via holes VH1 to VH3.

Then, in the step illustrated in FIG. 10A, the via wirings V1, V2 are respectively formed in the via holes VH1, VH2 and the wiring layer 62 is stacked on the inter-layer insulating layer 61. The wiring layer 62 is electrically connected to the wiring layer 43 and the connection terminal 52 through the via wirings V1, V2. The via wiring V3 is formed in the via hole VH3, and the wiring layer 72 is stacked on the inter-layer insulating layer 71. The wiring layer 72 is electrically connected to the wiring layer 44 through the via wiring V3. The via wirings V1 to V3 and the wiring layers 62, 72 can be formed using, for example, various types of wiring formation processes such as a semi-additive process, a subtractive process, or the like.

In the step illustrated in FIG. 10B, the steps illustrated in FIGS. 9A to 10A are repeated to stack the inter-layer insulating layer 63 and the wiring layer 64 on the inter-layer insulating layer 61 and stack the inter-layer insulating layer 73 and the wiring layer 74 on the inter-layer insulating layer 71. This forms the wiring structure 60 on the first surface 45A of the insulating layer 45, and forms the wiring structure 70 on the second surface 45B of the insulating layer 45.

In the step illustrated in FIG. 11A, the solder resist layer 81 including the opening 81X is stacked on the inter-layer insulating layer 63. The opening 81X exposes a certain location of the wiring layer 64 as the pad P1. Furthermore, the solder resist layer 82 including the opening 82X is stacked on the inter-layer insulating layer 73. The opening 82X exposes a location of the wiring layer 74 as the external connection pad P2. The solder resist layers 81, 82 can be formed, for example, by laminating the photosensitive solder resist film (or applying liquid solder resist), and patterning the resist film (or solder resist) to a required shape. An Ni layer and an Au layer, for example, may be stacked in this order on the pad P1 and the external connection pad P2 to form a metal layer if necessary. The metal layer can be formed, for example, through electroless plating. The wiring substrate 30 illustrated in FIG. 1 can be manufactured through the above manufacturing steps.

A method for manufacturing the semiconductor device 20 will now be described.

In the step illustrated in FIG. 11B, the external connection terminal 27 is formed on the external connection pad P2. For example, flux is applied to the external connection pad P2, and then the external connection terminal 27 (solder ball herein) is mounted on the external connection pad P2. The reflow process is performed at a temperature of about 240° C. to 260° C. to fix the external connection terminal 27 to the external connection pad P2. Thereafter, unnecessary flux is removed by performing a surface washing process. In the step illustrated in FIG. 11B, the semiconductor element 25 is mounted on the wiring substrate 30. In the present example, the bumps 25A of the semiconductor element 25 are flip-chip joined with the pads P1 of the wiring substrate 30. Then, the gap between the flip-chip joined wiring substrate 30 and the semiconductor element 25 is filled with the underfill resin 26 (see FIG. 1), and the underfill resin 26 is cured.

The semiconductor device 20 illustrated in FIG. 1 can be manufactured in the above manufacturing steps.

The present embodiment has the advantages described below.

(1) The plurality of bores 41Y, each including a single chip capacitor 50, are formed in the core 41, and part of the core 41 is arranged as the partition 41P between the adjacent bores 41Y. Thus, even when the chip capacitor 50 is moved in the planar direction inside the bore 41Y during the formation of the insulating layer 45, the chip capacitor 50 only contacts the partition 41P. This limits contact and short-circuiting of the connection terminals 52 and the adjacent chip capacitors 50.

(2) The partition 41P restricts displacement of the chip capacitor 50 from the designed position. This limits formation of the via hole VH2 and the via wiring V2 at positions deviated from the first surface 52A of the corresponding connection terminal 52. This improves the connection reliability of the chip capacitor 50 and the via wiring V2.

(3) The bores 41Y partitioned by the partition 41P are arranged in separated from each other in the single opening 43Y formed in the wiring layer 43 (or one opening 44Y formed in the wiring layer 44). This limits enlargement of the planar region in the core 41 and the wiring layers 43, 44 used to form the bores 41Y.

Figure 18:
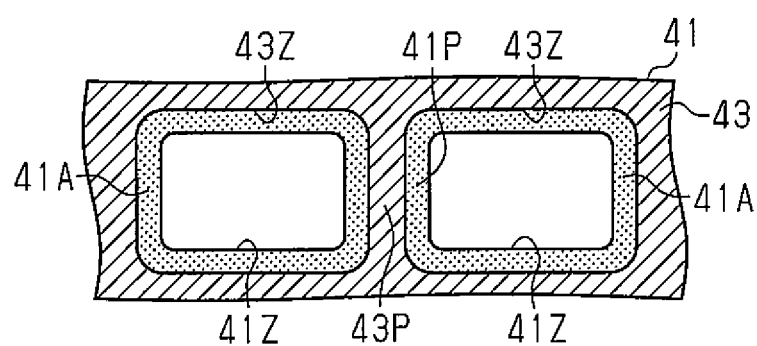
FIG. 18 is a schematic plan view illustrating a portion of a wiring substrate in a referential example.

For example, FIG. 18 illustrates a case in which the bores 41Z (electronic component accommodation bores), which extend through the core 41, are formed respectively in portions of the core 41 exposed from the openings 43Z formed in the wiring layer 43. That is, each of the bores 41Z is exposed from a corresponding one of the openings 43Z of the wiring layer 43. This structure increases the size of the planar shape of the region required in the core 41 and the wiring layers 43, 44 to form the bores 41Z. In other words, in the referential example (comparative example) illustrated in FIG. 18, a partition 43P formed by part of the wiring layer 43 is located between the adjacent bores 41Z to partition the adjacent openings 43Z of the wiring layer 43 in plan view. Although not illustrated in FIG. 18, a partition formed by part of the wiring layer 44 is also located between the adjacent bores 41Z to partition the adjacent openings of the wiring layer 44 in plan view. Thus, the width of the partition 41P formed by part of the core 41, that is, the interval of adjacent bores 41Z is increased by the partition 43P of the wiring layer 43 (and the partition of the wiring layer 44). This enlarges the planar region including the plurality of bores 41Z.

In contrast, in the present embodiment, the wiring layer 43 (and the wiring layer 44) is not located between the adjacent bores 41Y in plan view (see FIGS. 1 and 2). This limits enlargement of the planar region including the bores 41Y for accommodating the chip capacitors 50 (electronic components) due to the absence of the wiring layer 43 (partition 43P as in FIG. 18) and the wiring layer 44 (its partition).

(4) Even if the partition 41P is damaged by the movement of the chip capacitor 50 in the planar direction and the partition 41P is moved in the planar direction with the chip capacitor 50, the partition 41P remains between the adjacent chip capacitors 50. This restricts contact of the chip capacitors 50 with each other. Therefore, the width of the partition 41P may be reduced as much as possible.

(5) When forming the insulating layer 45, a gap is formed between the first surface (lower surface in FIG. 7A) of the partition 41P and the adhesive film 90. Thus, the adjacent bores 41Y are communicated through the gap, and the fluidity of the insulating resin is increased in the bores 41Y.

(6) The thickness from the first surface (upper surface in FIG. 9) of the wiring layer 43 to the first surface (upper surface in FIG. 9A) of the inter-layer insulating layer 61 and the thickness from the second surface (lower surface in FIG. 9A) of the wiring layer 44 to the second surface (lower surface in FIG. 9A) of the inter-layer insulating layer 71 are set to be substantially the same. This improves the handling properties of the structure during manufacturing.

It should be apparent to those skilled in the art that the present invention may be embodied in many other specific forms without departing from the spirit or scope of the invention. Particularly, it should be understood that the present invention may be embodied in the following forms.

In the embodiment described above, the core 41 includes only the single insulating layer. The structure of the core 41 is not limited in such a manner.

For example, as illustrated in FIGS. 12A and 12B, the core 41 may include a plurality of insulating layers. Such core 41 is, for example, a multi-layer print wiring board. The core 41 includes a core substrate 101, wiring layers 102, 103 serving as the internal wiring layer, and insulating layers 105, 106. FIG. 12A illustrates a cross-sectional structure of the structure corresponding to the step illustrated in FIG. 6A, and FIG. 12B illustrates a cross-sectional structure of the structure corresponding to the step illustrated in FIG. 7A.

For example, thermosetting insulating resin containing a reinforcement material can be used as the material of the core substrate 101 and the insulating layers 105, 106. For example, glass epoxy resin can be used as the material of the core substrate 101 and the insulating layers 105, 106.

The core substrate 101 and the insulating layers 105, 106 each includes a certain number (one herein) of glass clothes 101G, 105G, 106G. The glass clothes 101G, 105G, 106G are each formed by, for example, a glass fiber bundle arranged in a first direction and a glass fiber bundle arranged in a second direction, which is orthogonal in plan view to the first direction, that are plain woven to have a grid form. Other than the glass clothes 101G, 105G, 106G using the glass fiber bundle, a woven cloth or an unwoven cloth using a carbon fiber bundle, a polyester fiber bundle, a nylon fiber bundle, an aramid fiber bundle, an LCP fiber bundle, or the like may be used. The weaving method of the fiber bundle is not limited to plain weaving, and may be sateen weaving, twill weaving, or the like.

The wiring layer 102 is formed on the first surface (lower surface herein) of the core substrate 101, and the wiring layer 103 is formed on the second surface (upper surface herein) of the core substrate 101. The wiring layers 102, 103 include, for example, a plane layer such as a power supply plane and a GND plane. The insulating layer 105 that covers the wiring layer 102 is stacked on the first surface of the core substrate 101, and the insulating layer 106 that covers the wiring layer 103 is stacked on the second surface of the core substrate 101. Copper and copper alloy, for example, can be used as the material of the wiring layers 102, 103.

The through hole 41X is formed in certain locations (two areas herein) in the core 41 (core substrate 101 and insulating layers 105, 106). The through hole 41X extends through the core substrate 101 and the insulating layers 105, 106 in the thickness direction. The through electrode 42 that extends through the core 41, that is, the core substrate 101 and the insulating layers 105, 106 in the thickness direction is formed in each through hole 41X. The through hole 41X is filled with the through electrode 42.

The wiring layer 43 is formed on the first surface (lower surface herein) of the insulating layer 105, that is, the first surface 41A of the core 41, and the wiring layer 44 is formed on the second surface (upper surface herein) of the insulating layer 106, that is, the second surface 41B of the core 41. The wiring layers 43, 44 are electrically connected to each other through each through electrode 42.

In the same manner as the embodiment described above, the bores 41Y, the number (two herein) of which is the same as the incorporated chip capacitors 50, are formed in the core 41 (core substrate 101 and insulating layers 105, 106). Each bore 41Y extends through the core substrate 101 and the insulating layers 105, 106 in the thickness direction. In this case, the partition 41P formed between the adjacent bores 41Y is configured only by the insulating material, that is, only by the core 41 that includes the core substrate 101 and the insulating layers 105, 106.

As illustrated in FIGS. 12A and 12B, the bore 41Y may have a cross-sectional shape in which a middle part in a depth direction of the bore 41Y is the narrowest. In other words, a projection A1 that projects toward the inner side from the inner wall of the bore 41Y (core section 41) is formed at the middle part in the depth direction of the bore 41Y. Thus, the opening width of the bore 41Y is the narrowest at the projection A1, and the opening width of the bore 41Y increases from the projection A1 toward each open end. For example, the inner wall of the bore 41Y excluding the side surface of the partition 41P is inclined such that the opening width of the bore 41Y increases from the projection A1 toward each open end. In the present example, the projection A1 is formed at a position close to the first surface 41A of the core 41 than the center in the thickness direction of the core 41. For example, the projection A1 is formed near the glass cloth 105G of the insulating layer 105. Such bore 41Y can be formed, for example, by a laser machine from the second surface 41B of the core 41. The irradiation conditions of the laser (power, irradiation time, etc. of laser) in this case are set based on the material and the thickness of the core substrate 101 and the insulating layers 105, 106, the material and the thickness of the reinforcement material (glass clothes 101G, 105G, 106G), the stacked number of core 41, and the like.

When the laser processing is performed on the insulating layers 105, 106 and the core substrate 101, which is formed by impregnating the glass clothes 101G, 105G, 106G with insulating resin, the processing rate of the laser machine differs between the glass cloth portion and the insulating resin portion. Specifically, the processing rate of the insulating resin portion is higher than the machining rate of the glass cloth portion. Thus, when the bore 41Y is formed by performing laser processing from the second surface 41B of the core 41 including the core substrate 101 and the insulating layers 105, 106, the middle part (i.e., glass cloth portion) in the thickness direction of the core 41 projects toward the inner side of the bore 41Y. The glass cloth portion is thereby formed as the projection A1. In this case, the projection A1 is formed biased to a position close to the first surface 41A (i.e., surface on the side opposite to the second surface 41B that is subjected to laser processing) than the center of the core 41 in the thickness direction. Thus, in the laser processing, the laser is irradiated under a predetermined irradiation condition with respect to the core 41 from the second surface 41B of the core 41 so that the projection A1 is formed on the wall surface of the bore 41Y.

Thus, the inclined surface is formed on the inner wall of the bore 41Y so that the opening width of the bore 41Y becomes greater from the projection A1 toward the open end in the second surface 41B of the core 41. Thus, as illustrated in FIG. 12B, when forming the insulating layer 45, the fluidity of the insulating resin to be filled into the bore 41Y can be enhanced and the involvement of voids in the insulating layer 45 can be suitably suppressed. Furthermore, the insulating resin to be filled into the bore 41Y also spreads also in a direction of moving away from the chip capacitor 50, as illustrated with an arrow in FIG. 12B, at the position close to the adhesive film 90 than the projection A1. Thus, the pressure of the insulating resin filled in the bore 41Y is dispersed, whereby the chip capacitor 50 can be suitably suppressed from moving in the planar direction by the pressure of the insulating resin.

Furthermore, the width of the open end of the bore 41Y at the side closer to the projection A1 in the first surface 41A of the core 41 becomes smaller than the width of the other open end in the second surface 41B of the core 41. The insulating layer stacked on the open end side having a narrow width is less influenced by the opening width of the bore 41Y than the insulating layer stacked on the open end side having a wide width. Hence, the flatness of the surface of the insulating layer becomes higher. Therefore, the inter-layer insulating layer 61 (see FIG. 1) stacked on the first surface 41A of the core 41 has a higher flatness of the surface than the inter-layer insulating layer 71 (see FIG. 1) stacked on the second surface 41B of the core 41. Thus, the flatness of the inter-layer insulating layer 61 included in the wiring structure 60 on the semiconductor element mounting surface side can be improved. Therefore, the wiring layers 62, 64 of the wiring structure 60 can easily be miniaturized when the terminals of the semiconductor element 25 are increased. Since the surface (first surface 41A herein) closer to the projection A1 of the core 41 is the semiconductor element mounting surface side, the miniaturization of the wiring layer is facilitated.

Figure 13:
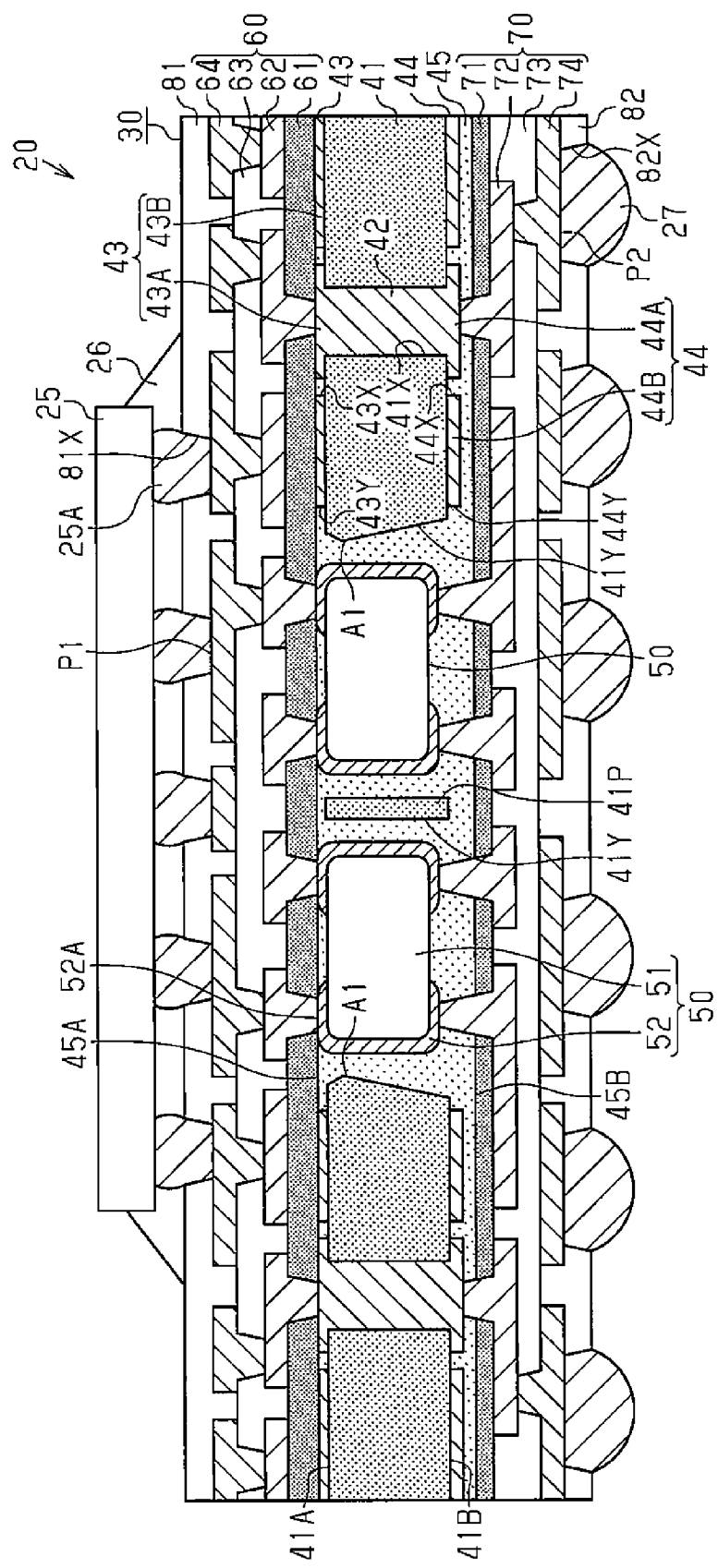
FIG. 13 is a schematic cross-sectional view illustrating a semiconductor device of another modified example.

As illustrated in FIG. 13, the core 41 in the modified example illustrated in FIGS. 12A and 12B may be changed to a single insulating layer made from an insulating resin containing glass cloth (reinforcement material). Even with a single insulating layer containing reinforcement material, the bore 41Y in which the projection A1 is formed at the middle part in the depth direction can be formed by a laser machine in the same manner as the modified examples described above.

The cross-sectional shape of the partition 41P in the embodiment and the modified examples described above is not particularly limited.

Figure 14A:
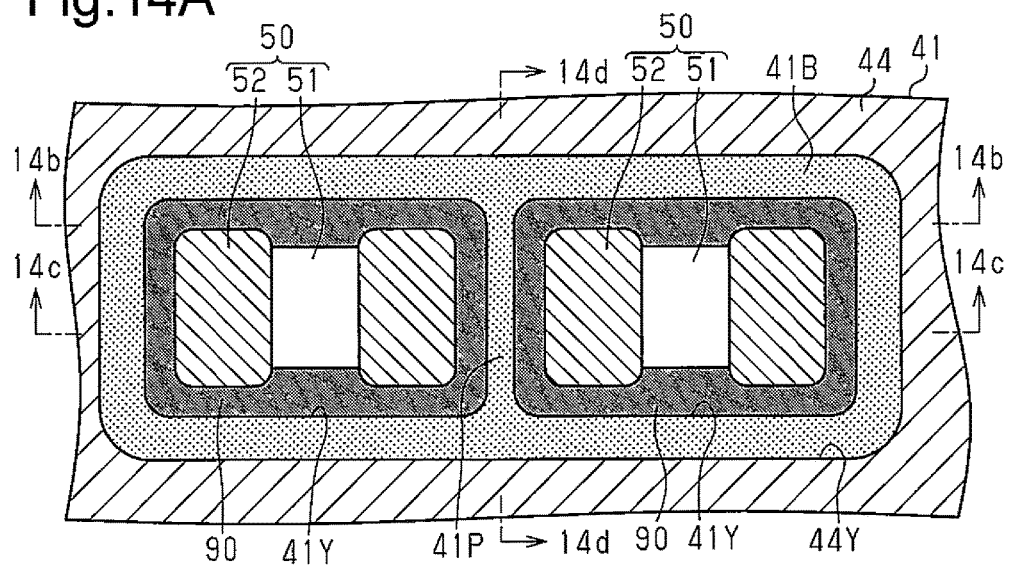
Figure 14B:
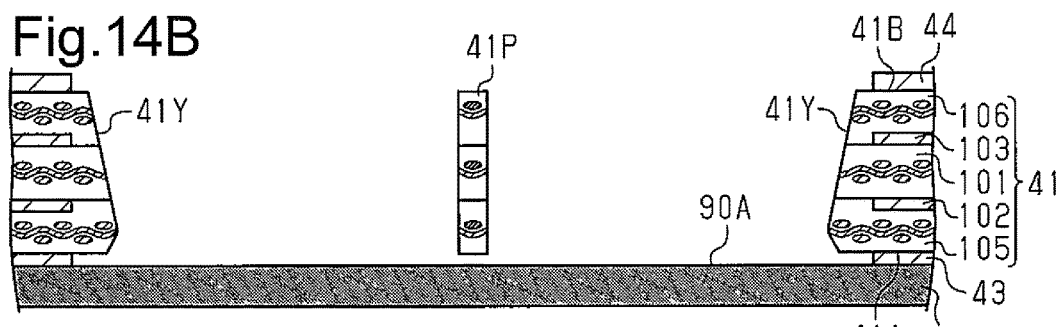
Figure 14C:
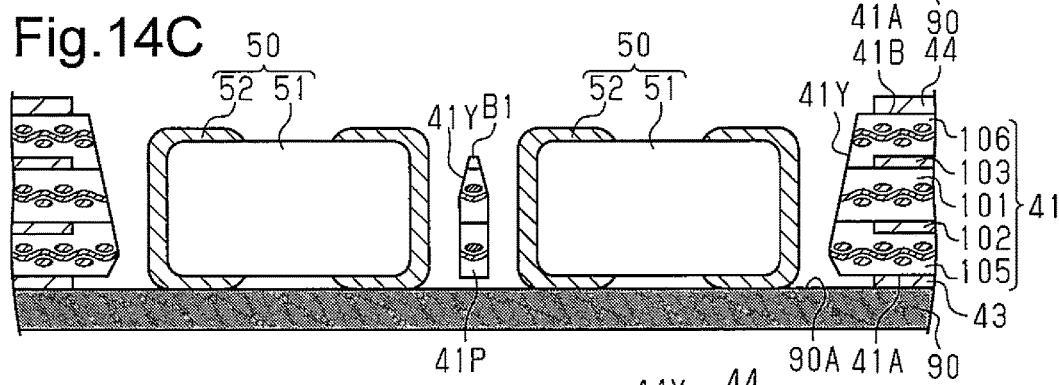
Figure 14D:
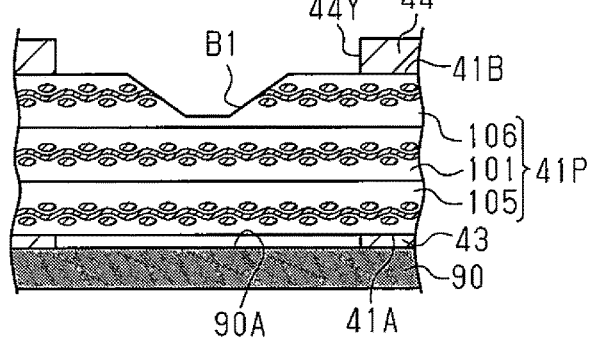

For example, as illustrated in FIGS. 14B to 14D, at least part of the partition 41P may be thinner than the core 41 at portions excluding the partition 41P. FIG. 14A illustrates a plane structure of the structure corresponding to the step illustrated in FIG. 6B, and FIGS. 14B to 14D each show a cross-sectional structure of the structure at the position taken along line 14b-14b, the position taken along line 14c-14c, and the position taken along line 14d-14d of FIG. 14A.

As illustrated in FIG. 14A, the partition 41P is formed to have a substantially rectangular shape in plan view. As illustrated in FIG. 14D, a recess B1 thinner than other portions is formed at substantially the central part in the longitudinal direction of the partition 41P (direction in which the partition 41P is extended). In other words, the recess B1 is formed near the position where the chip capacitor 50 is mounted. The recess B1 is formed, for example, by thinning the insulating layer 106 of the core 41. In the present example, the recess B1 is formed such that the cross-sectional shape in the longitudinal direction of the partition 41P is substantially trapezoidal. As illustrated in FIGS. 14C and 14D, the partition 41P includes a first surface (lower surface herein) flush with the first surface 41A of the core 41 at portions excluding the partition 41P. Furthermore, the partition 41P includes a second surface located on the plane closer to the wiring layer 43 than the second surface 41B of the core 41 other than the partition 41P. The second surface of the partition 41P corresponds to the bottom surface of the recess B1. Moreover, as illustrated in FIG. 14C, the side surface of the partition 41P at the portion where the recess B1 is formed is inclined so that the opening width of the bore 41Y becomes greater from the middle part in the thickness direction of the partition 41P toward the second surface (e.g., bottom of recess B1) of the partition 41P. As illustrated in FIG. 14B, the surface (upper surface herein) of the partition 41P at the portion where the recess B1 is not formed is flush with the second surface 41B of the core 41 at portions other than the partition 41P.

Such a partition 41P (bore 41Y) can be formed, for example, through laser machine processing. The irradiation condition (power, irradiation time, etc. of laser) of the laser in this case is set based on the material and the thickness of the core 41 (e.g., core substrate 101 and insulating layers 105, 106), the stacked number of the core 41, the width of the partition 41P, and the like.

When part of the partition 41P is thinner than the core 41 at portions excluding the partition 41P, the barrier (partition 41P) that decreases the fluidity of the insulating resin becomes low. Thus, the fluidity of the insulating resin can be enhanced when the bore 41Y is filled with the insulating resin. Furthermore, the fluidity of the insulating resin in the bore 41Y can be further improved since the side surface of the partition 41P is an inclined surface (FIG. 14C). Thus, the narrow gap between the chip capacitor 50 and the partition 41P may also be filled with the insulating resin. This reduces the formation of voids in the insulating layer 45.

In the embodiment and each modified example described above, the two adjacent chip capacitors 50 are arranged so that the longitudinal end faces of the capacitor main bodies 51 face each other through the partition 41P (see e.g., FIG. 2). However, the mounting direction of the chip capacitor 50 is not limited in such a manner.

Figure 15A:
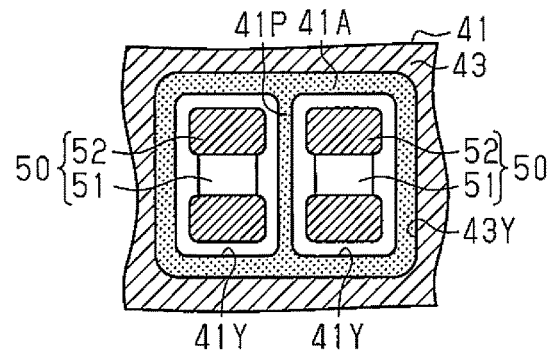

For example, as illustrated in FIG. 15A, the two adjacent chip capacitors 50 may be arranged such that the end faces in the short direction of the capacitor main bodies 51 face each other through the partition 41P.

In the embodiment and each modified example described above, two chip capacitors 50 are incorporated in the wiring substrate 30. Instead, three or more chip capacitors 50 may be incorporated in the wiring substrate 30.

Figure 15B:
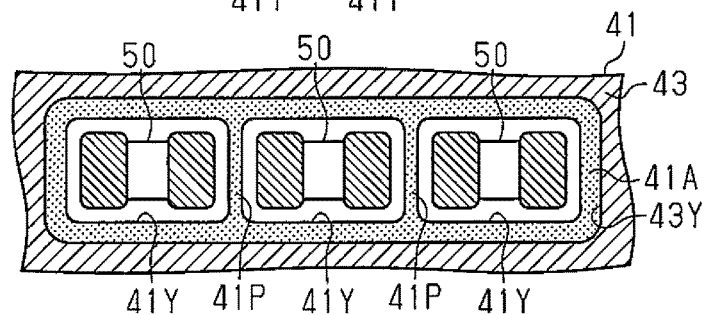

For example, as illustrated in FIG. 15B, when incorporating three chip capacitors 50 in the wiring substrate 30, three bores 41Y, partitioned by partitions 41P formed by parts of the core 41, are arranged in a separated manner in one opening 43Y (or one opening 44Y) of the wiring layer 43. Thus, even if three or more bores 41Y are arranged, only the partition 41P of the core 41 is arranged between the adjacent bores 41Y.

Figure 15C:
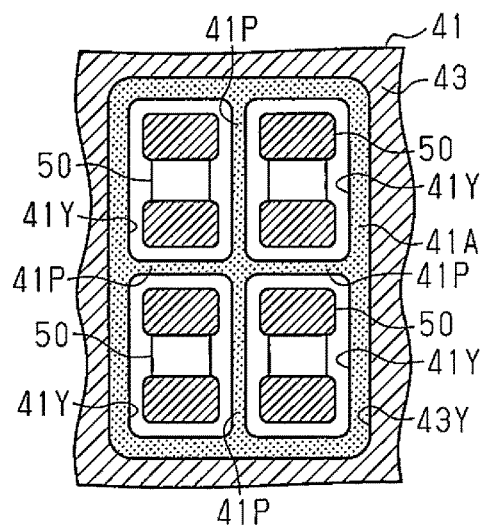

As illustrated in FIG. 15C, four or more chip capacitors 50 may be arranged in a matrix form in plan view. In this case, the partition 41P is formed between the bores 41Y adjacent to one another in the vertical direction as viewed in the drawing, and the partition 41P is also formed between the adjacent bores 41Y in the lateral direction as viewed in the drawing.

Figure 16A:
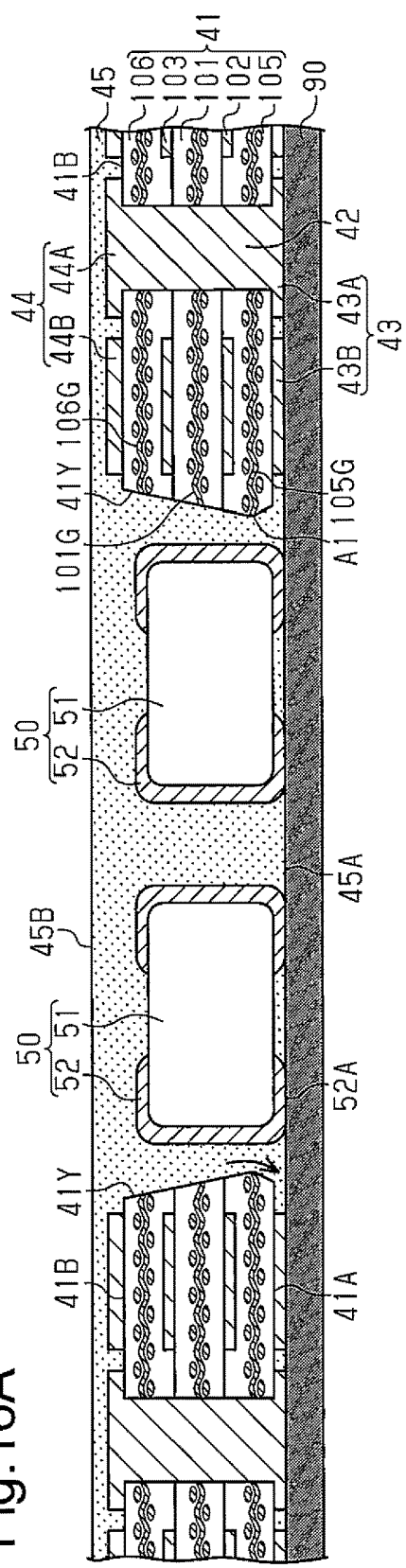
FIG. 16A is a schematic cross-sectional view illustrating a method for manufacturing a wiring substrate of another modified example (cross sectional view taken along line 16a-16a in FIG. 16B)
Figure 16B:
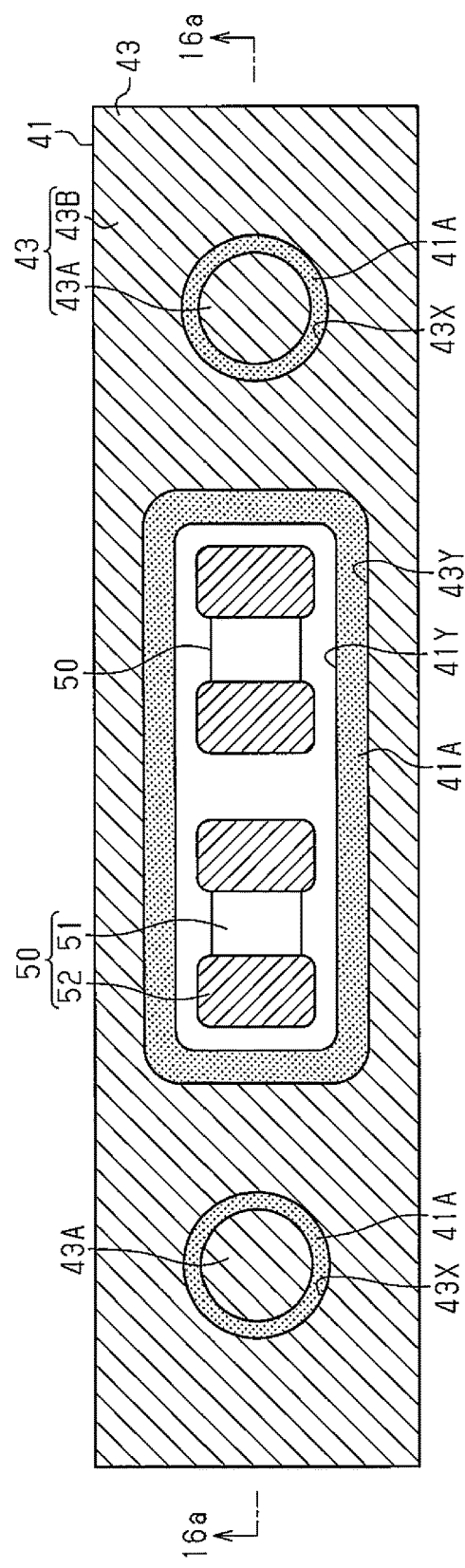
FIG. 16B is a schematic plan view illustrating the method for manufacturing the wiring substrate of FIG. 16A.
Figure 17:
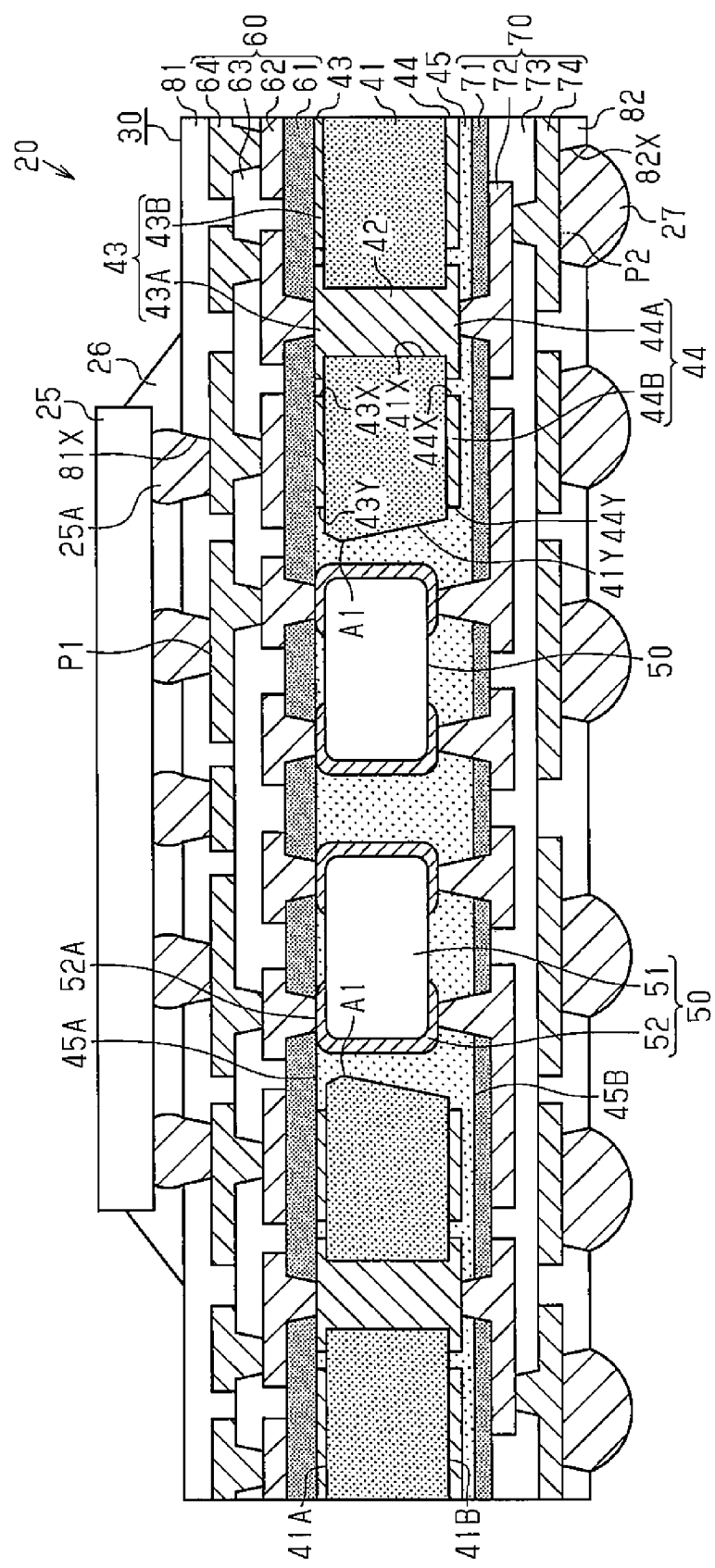
FIG. 17 is a schematic cross-sectional view illustrating a semiconductor device of another modified example.

As illustrated in FIGS. 16A and 16B, the partition 41P in the modified example illustrated in FIG. 12B may be omitted. Furthermore, as illustrated in FIG. 17, the partition 41P in the modified example illustrated in FIG. 13 may be omitted. In other words, when the projection A1 projecting toward the inner side of the bore 41Y is formed at the middle part in the depth direction of the bore 41Y, the partition 41P may be omitted. In this case, two chip capacitors 50 are arranged in one bore 41Y.

In the modified examples illustrated in FIGS. 16A, 16B, and 17, the opening width of the bore 41Y is the smallest at the projection A1 like the modified examples illustrated in FIGS. 12A, 12B, 13. The opening width of the bore 41Y increases from the projection A1 toward each open end.

Thus, since the pressure of the insulating resin in the bore 41Y is dispersed when forming the insulating layer 45, movement of the chip capacitor 50 in the planar direction is restricted when the pressure of the insulating resin is applied. This limits displacement of the chip capacitor 50, and contact between the chip capacitors 50 is limited. As a result, short circuiting is limited in the connection terminals 52 of the chip capacitors 50.

Further, in the modified examples illustrated in FIGS. 16A, 16B, and 17, the projection A1 exists at a position closer to the first surface 41A than the central part in the thickness direction of the core 41, and the first surface 41A of the core 41 is used as the semiconductor element mounting surface side like in the modified examples illustrated in FIGS. 12A, 12B, and 13. Thus, the wiring layer resulting from an increase in terminals of the semiconductor element 25 can be easily miniaturized.

In the modified examples illustrated in FIGS. 16A, 16B, and 17, a plurality of chip capacitors 50 is arranged in one bore 41Y. Instead, one chip capacitor 50 may be arranged in each bore 41Y. Also, in this case, the formation of the projection A1 on the wall surface of the bore 41Y restricts displacement of the chip capacitor 50.

In the embodiment and each modified example described above, the first surface 52A of each connection terminal 52 of the chip capacitor 50 is formed on the same plane as the first surface (upper surface in FIG. 1) of the wiring layer 43. This is not the sole case, and for example, the first surface 52A of each connection terminal 52 may be projected out to the upper side or the lower side than the first surface (upper surface in FIG. 1) of the wiring layer 43.

In the embodiment and each modified example described above, the insulating material in the bore 41Y covering the first surface 41A and the second surface 41B of the core 41 includes only one insulating layer 45 but may include two or more insulating layers. For example, the insulating material may include a first insulating layer that is formed in part of the bore 41Y covering the first surface 41A of the core 41 and a second insulating layer that is formed in the remaining portion of the bore 41Y covering the second surface 41B of the core 41.

In the embodiment and each modified example described above, the via wiring V2 is formed only on the first surface 52A of each connection terminal 52. Instead, for example, the via wiring may be further formed on the second surface (side opposite to the first surface 52A) of each connection terminal 52, as illustrated in FIGS. 13 and 17.

In the wiring substrate 30 of the embodiment and each modified example described above, the chip capacitor 50 is thinner than the core 41. Instead, for example, in the wiring substrate 30, the chip capacitor 50 may be thicker than the core 41 or have the same thickness as the core 41.

In the embodiment and each modified example described above, the chip capacitor 50 including two connection terminals 52 is incorporated in the wiring substrate 30. Instead, for example, an electronic component such as a capacitor including three or more connection terminals 52 may be incorporated in the wiring substrate 30.

In the embodiment and each modified example described above, the chip capacitor 50 is incorporated in the wiring substrate 30 as an electronic component. Instead, an electronic component such as a chip resistor, an inductor, a semiconductor device (LSI), or the like may be incorporated. Furthermore, the electronic component incorporated in the wiring substrate 30 is not limited to one type, and plural types of electronic components may be incorporated in the wiring substrate 30.

In the embodiment and each modified example described above, the through hole 41X is filled with the through electrode 42. Instead, for example, the through electrode 42 may be formed as a conformal via. In other words, the shape of the through electrode 42 is not particularly limited as long as the through electrode covers the wall surface of the through hole 41X and electrically connects the wiring layers 43, 44 respectively formed on the first surface 41A and the second surface 41B of the core 41.

The number of layers, the layout of the wirings, and the like of the wiring layers 62, 64 and the inter-layer insulating layers 61, 63 in the wiring structure 60 of the embodiment and each modified example described above can be modified and changed in various manners.

The number of layers, the layout of the wirings, and the like of the wiring layers 72, 74 and the inter-layer insulating layers 71, 73 in the wiring structure 70 of the embodiment and each modified example described above can be modified and changed in various manners.

In the embodiment and each modified example described above, the method is applied to manufacture a single product (one product) but may be applied to apply a batch of products.

The number of semiconductor elements 25 mounted on the wiring substrate 30 of the semiconductor device 20, the mounting mode of the semiconductor element 25 (e.g., flip-chip mounting, mounting by wire bonding, or combination thereof), and the like in the embodiment and each modified example described above can be modified and changed in various manners.

CLAUSES

This disclosure further encompasses the following embodiment.

1. A method for manufacturing a wiring substrate, the method including:

forming a structure including a core, a first wiring layer, and a second wiring layer, wherein the first wiring layer is formed on a first surface of the core and includes a first opening, and the second wiring layer is formed on a second surface of the core and includes a second opening;

forming a plurality of electronic component accommodating bores that extend through the core in the thickness direction at portions exposed from the first opening and the second opening, wherein the electronic component accommodating bores are partitioned by a partition, and the partition is formed by part of the core and located between adjacent ones of electronic component accommodating bores;

adhering a film, which covers the electronic component accommodating bores, to a first surface side of the core;

arranging an electronic component in each of the electronic component accommodating bores and fixing each of the electronic components onto the film;

forming an insulating material that covers the first surface and the second surface of the core, wherein the electronic component accommodating bores are filled with the insulating material;

removing the film;

forming a first wiring structure on the insulating material that covers the first surface of the core; and forming a second wiring structure on the insulating material that covers the second surface of the core.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
a core including a first surface and a second surface located at a side opposite to the first surface, wherein the core includes a plurality of electronic component accommodating bores that extend through the core in a thickness direction between the first surface and the second surface;
a first wiring layer formed on the first surface of the core, wherein the first wiring layer includes a first opening;
a second wiring layer formed on the second surface of the core, wherein the second wiring layer includes a second opening;
a plurality of electronic components, the number of which is the same as the number of the electronic component accommodating bores incorporated in the wiring substrate, wherein each of the electronic component accommodating bores is sized to accommodate only a single one of the electronic components;
an insulating material covering the first surface and the second surface of the core, wherein the electronic component accommodating bores are filled with the insulating material;
a first wiring structure formed on a first surface side of the core; and
a second wiring structure formed on a second surface side of the core;
wherein the electronic component accommodating bores extend through the core at portions exposed from the first opening of the first wiring layer and the second opening of the second wiring layer, and
the core includes a first portion surrounding the electronic component accommodating bores and a second portion connected to the first portion, wherein the second portion of the core defines a partition isolating adjacent ones of the electronic component accommodating bores from each other, wherein the partition is formed by an entire part of the second portion of the core located between the adjacent electronic component accommodating bores, wherein the partition is entirely exposed in each of the first opening of the first wiring layer and the second opening of the second wiring layer in a plan view.

2. The wiring substrate according to claim 1, wherein each of the electronic components includes a first surface located in the first opening of the first wiring layer and exposed from the insulating material;
the insulating material includes a first surface that is flush with the first surface of each of the electronic components; and
the first wiring layer includes a first surface that is flush with the first surface of the insulating material and the first surface of each electronic component.

3. The wiring substrate according to claim 2, wherein each of the electronic component accommodating bores includes a first open end, which opens in the first surface of the core, and a second open end, which opens in the second surface of the core; and
each of the electronic component accommodating bores is formed so that an opening width of each electronic component accommodating bore increases from a middle part in the thickness direction of the core toward each of the first and second open ends.

4. The wiring substrate according to claim 3, wherein the middle part of the core is located closer to the first surface of the core than a center of the core in the thickness direction.

5. The wiring substrate according to claim 1, wherein at least part of the partition is thinner than the first portion of the core.

6. The wiring substrate according to claim 1, wherein the partition includes
- a first surface extending along a plane flush with the first surface of the core at the first portion of the core, and
- a second surface extending along a plane located closer to the first wiring layer than the second surface of the core at the first portion of the core.

7. The wiring substrate according to claim 6, wherein the partition includes a side surface that is an inclined surface, the inclined surface is formed so that an opening width of each of the electric component accommodating bores increases from a middle part of the partition in the thickness direction toward the second surface of the partition.

8. The wiring substrate according to claim 2, wherein the first wiring structure includes:
- a first inter-layer insulating layer that covers the first surface of the first wiring layer, the first surface of the insulating material, and the first surface of each of the electronic components; and
- a third wiring layer electrically connected to the electronic components and the first wiring layer by a plurality of via wirings that extend through the first inter-layer insulating layer; and the second wiring structure includes:
- a second inter-layer insulating layer that covers a second surface of the insulating material located at a side opposite to the first surface of the insulating material; and
- a fourth wiring layer electrically connected to at least the second wiring layer by at least one via wiring that extends through the insulating material and the second inter-layer insulating layer.

9. A semiconductor device comprising:

the wiring substrate according to claim 1; and a semiconductor element connected to an uppermost wiring layer in the first wiring structure.

* * * * *

UNITED STATES PATENT AND TRADEMARK OFFICE
CERTIFICATE OF CORRECTION

PATENT NO. : 9,961,785 B2
APPLICATION NO. : 14/848453
DATED : May 1, 2018
INVENTOR(S) : Junji Sato et al.

Page 1 of 1

It is certified that error appears in the above-identified patent and that said Letters Patent is hereby corrected as shown below:

On the Title Page

Column 1 (Assignee), Line 1, after "Electric" insert -- Industries --.

Signed and Sealed this
Tenth Day of July, 2018

Andrei Iancu
*Director of the United States Patent and Trademark Office*